United States Patent [19]
Ciccone et al.

[11] Patent Number: 6,052,407
[45] Date of Patent: Apr. 18, 2000

[54] APPARATUS AND METHOD FOR DETECTION FREQUENCY HOPPING PATTERNS EMBEDDED IN RADIO FREQUENCY NOISE

[75] Inventors: Joseph L Ciccone, Neptune; David C. Nall, Lincroft; Chu Ng, Woodbridge, all of N.J.

[73] Assignee: Lucent Technologies Inc., Murray Hill, N.J.

[21] Appl. No.: 08/942,025

[22] Filed: Oct. 1, 1997

[51] Int. Cl.⁷ .............................. H04B 15/00; H04K 1/00; H04L 27/30
[52] U.S. Cl. .......................... 375/202; 455/462; 455/463
[58] Field of Search ..................................... 375/200, 202; 455/462, 464, 463, 465, 554, 555

[56] References Cited

U.S. PATENT DOCUMENTS

| | | | |
|---|---|---|---|
| 5,528,623 | 6/1996 | Foster, Jr. ................................. | 375/202 |
| 5,758,290 | 5/1998 | Nealon et al. .......................... | 455/464 |
| 5,774,808 | 6/1998 | Sarioja et al. .......................... | 455/436 |
| 5,802,110 | 9/1998 | Watanabe et al. ...................... | 375/259 |
| 5,818,885 | 10/1998 | Kim ........................................ | 375/354 |
| 5,872,519 | 2/1999 | Issa et al. ............................ | 340/825.31 |
| 5,940,431 | 8/1999 | Haartsen et al. ........................ | 375/202 |

*Primary Examiner*—Chi H. Pham
*Assistant Examiner*—Bryan Webster
*Attorney, Agent, or Firm*—Samuel R. Williamson

[57] ABSTRACT

Communication links are quickly and reliably established between units of a cordless telephone configured for operating in a frequency hopping system. This is achieved through specific processes which detects frequency hopping patterns that are embedded in radio frequency noise. A first process is executed by the base unit and/or each of multiple handset units in the cordless telephone for performing a link acquisition with another unit, also in the cordless telephone. In the execution of this process, multiple profile scans of the frequency hopping channels are executed to build up over time tables with information about energy in all of the channels in the frequency spectrum that are used by the units in the cordless telephone for frequency hopping. In the tables will be spectrum energy from a frequency hopping base unit or handset unit that appears as a recognizable pattern. By applying correlation techniques to the pattern in each table, information is obtained which reflects the probability that a hopping pattern for an associated unit in the cordless telephone has been detected. The unit obtaining this information is then able to quickly join the frequency hopping cycle of the detected base unit or handset unit. An abbreviated second process also is executed by each of multiple handset units in the cordless telephone for performing a link acquisition with another unit, also in the cordless telephone. In the execution of this process, multiple profile scans of the frequency hopping channels are executed to build up over time tables with information about the energy in some minimum number of channels that are used by the units in the frequency spectrum. This process is executed when the searching unit has previous information as to the possible location for the hopping unit in the frequency hopping cycle. In this process, the frequency hopping cycle is easily detected and synchronization with this cycle quickly obtained.

14 Claims, 26 Drawing Sheets

TDD+ BASE TRANSMIT SUBFRAME STRUCTURE IN TRAFFIC MODE

TDD+ BASE RECEIVE SUBFRAME STRUCTURE IN TRAFFIC MODE
(PATH DELAY: 0 MILE)

TDD+ HANDSET TRANSMIT SUBFRAME STRUCTURE IN TRAFFIC MODE

TDD+ HANDSET RECEIVE SUBFRAME STRUCTURE IN TRAFFIC MODE
(PATH DELAY: 0 MILES)

TDD+ BASE TRANSMIT SUBFRAME STRUCTURE IN ACQUISITION MODE

TDD+ BASE TRANSMIT SUBFRAME STRUCTURE IN ACQUISITION MODE

TDD+ BASE TRANSMIT SUBFRAME STRUCTURE IN ACQUISITION MODE

TDD+ HANDSET TRANSMIT SUBFRAME STRUCTURE IN ACQUISITION MODE

BASE STATION LINK ACQUISITION FROM POWER UP

HANDSET (AS BASE) TO HANDSET LINK ACQUISITION FROM SLEEP CYCLE

APPARATUS AND METHOD FOR DETECTION FREQUENCY HOPPING PATTERNS EMBEDDED IN RADIO FREQUENCY NOISE

BACKGROUND OF THE INVENTION

1. Technical Field

This invention relates to cordless telephones and more particularly to a cordless telephone having a plurality of portable units arranged for communicating with a base unit in a frequency hopping system.

2. Description of the Prior Art

The Federal Communications Commission (FCC) recently promulgated rulings in the utilization of spread spectrum systems, including a frequency hopping system. These rulings now allow suppliers to produce improved cordless telephones which provide users much greater freedom and mobility than is available with conventional cordless telephones. Frequency hopping systems spread their energy by changing, or hopping the center frequency of the transmission many times a second in accordance with a pseudo-randomly generated list of communication channels. The result is a significantly higher signal to noise ratio than may be achieved by conventional techniques such as amplitude modulation that uses no bandwidth spreading.

These improved cordless telephones provide an increased operating range over what was previously available. They also provide security naturally from an eavesdropper listening in on a conversation simply because of the spread spectrum/frequency hopping transmission technique employed by these telephones. Examples of such improved cordless telephones are described in U.S. Pat. No. 5,323,447 which issued to M. E. Gillis et al. on Jun. 21, 1994, U.S. Pat. No. 5,353,341 which issued to M. E. Gillis et al. on Oct. 4, 1994 and U.S. Pat. No. 5,463,659 which issued to W. J. Nealon et al. on Oct. 31, 1995.

Although security is provided naturally in these cordless telephones from would be eavesdroppers listening in on conversations, the spread spectrum/frequency hopping transmission technique employed by these telephones also can make difficult the attempts of a legiminate user to obtain access from one of the units in these telephones to another. Since a communication link between units is maintained only during actual communications by users of the telephones, such link has to be reestablished before each use. It is therefore desirable that communication links between cordless telephone units that operating in a frequency hopping system be quickly easily and established.

SUMMARY OF THE INVENTION

In accordance with the invention, communication links are quickly and reliably established between units of a cordless telephone configured for operating in a frequency hopping system. This is achieved through specific processes which detects frequency hopping patterns that are embedded in radio frequency noise.

In accordance with an aspect of the invention, a first process is executed by the base unit and/or each of multiple handset units in the cordless telephone for performing a link acquisition with another unit, also in the cordless telephone. In the execution of this process, multiple profile scans of the frequency hopping channels are executed to build up over time tables with information about energy in all of the channels in the frequency spectrum that are used by the units in the cordless telephone for frequency hopping. In the tables will be spectrum energy from a frequency hopping base unit or handset unit that appears as a recognizable pattern. By applying correlation techniques to the pattern in each table, information is obtained which reflects the probability that a hopping pattern for an associated unit in the cordless telephone has been detected. The unit obtaining this information is then able to quickly join the frequency hopping cycle of the detected base unit or handset unit.

In accordance with another aspect of the invention, an abbreviated second process is executed by each of multiple handset units in the cordless telephone for performing a link acquisition with another unit, also in the cordless telephone. In the execution of this process, multiple profile scans of the frequency hopping channels are executed to build up over time tables with information about the energy in some minimum number of channels that are used by the units in the frequency spectrum. This process is executed when the searching unit has previous information as to the possible location for the hopping unit in the frequency hopping cycle. In this process, the frequency hopping cycle is easily detected and synchronization with this cycle quickly obtained.

BRIEF DESCRIPTION OF THE DRAWINGS

The invention and its mode of operation will be more clearly understood from the following detailed description when read with the appended drawing in which.

Throughout the drawing, the same element when shown in more that one figure is designated by the same reference numeral.

DETAILED DESCRIPTION

Figure 1:
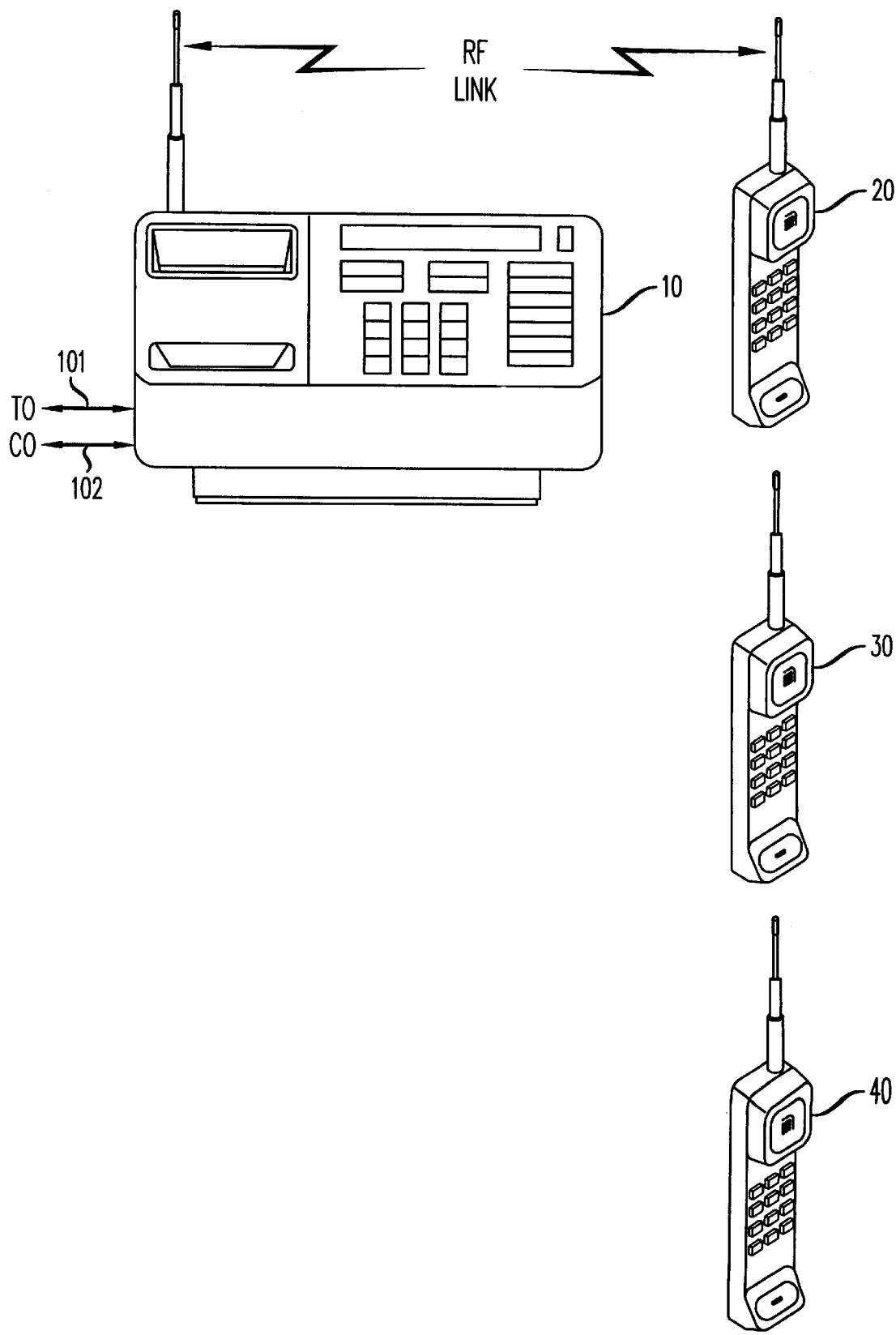
FIG. 1 shows a cordless telephone base unit and multiple portable units for communicating with the base unit.

Referring now to FIG. 1 of the drawing, there is shown a cordless telephone base unit 10 which provides access to a telephone central office (not shown) over two pairs of tip-ring lines 101 and 102, and multiple portable or handset units 20 through 40. Although three handset units are shown and described herein, it is to be understood that a greater or fewer number of handset units may be employed in practicing the principles of this invention.

In accordance with the disclosed embodiment, each of the handset units 20 through 40 may securely access the base unit 10 and commonly share a telephone line through this base unit or separately use each of the telephone lines connected to the base unit at the same time. Although an RF link is shown as existing only between base unit 10 and handset unit 20, such RF link may be established between the base unit and any two of the handset units 20, 30 or 40. Thus, incoming telephone calls received at the base unit 10 from the central office over any one of the tip-ring lines 101 or 102 may be answered by a person at either of the handset units 20 through 40. Similarly, a user of either of the handset units 20 through 40 may originate a call to go over either of these tip-ring lines 101 or 102 to the central office.

Also, in accordance with the disclosed embodiment, each of the handset units 20 through 40 may independently communicate with each other as well as with the base unit 10, as described in detail later herein. By way of example, handset unit 20 may be communicating with handset unit 30 while handset unit 40 is communicating with the base unit 10. Moreover, and in accordance with the invention, handset unit 20 may simultaneously communicate both with handset unit 30 and handset unit 40, as also described in detail later herein.

Figure 2:
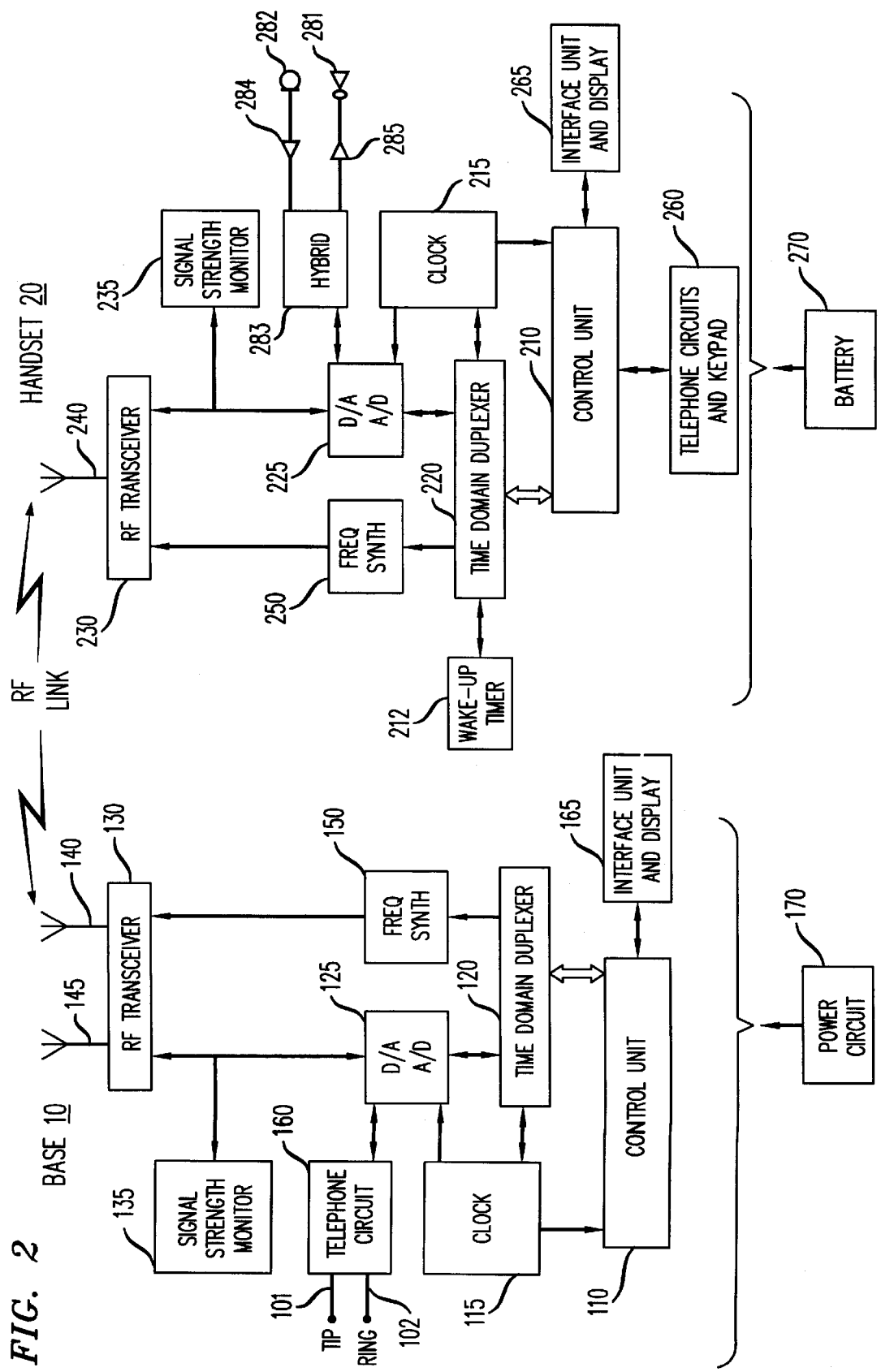
FIG. 2 is a functional block representation of a cordless telephone base unit and portable unit both operative in accordance with the principles of the present invention.

Referring next to FIG. 2 of the drawing, there is shown a general block diagram of certain circuitry of the cordless telephone base unit 10 and of the cordless telephone handset unit 20. With regard to the functional components illustratively described in handset unit 20, handset units 30 and 40 incorporate these same components and are operationally identical. Both base unit 10 and handset unit 20 are operable over a plurality of communication channels in a frequency hopping system.

A general overview of spread spectrum technology including frequency hopping systems is provided by R. C. Dixon, *Spread Spectrum Systems*, New York: John Wiley & Sons, 1984. The specific requirements for the frequency hopping system in which this cordless telephone is designed to operate are set forth in a Report and Order in General Docket No. 89-354, this Report and Order being adopted by the Federal Communications Commission on Jun. 14, 1990 and released on Jul. 9, 1990.

Included in the base unit 10 are a control unit 110, a clock 115 for providing synchronization to: 1) the control unit 110; 2) a time division duplexer (TDD) 120; and 3) a combined digital-to-analog and analog-to-digital (D/A+A/D) converter 125. Also included in the base unit 10 is a radio frequency (RF) transceiver 130, a signal strength monitor circuit 135, antennas 140 and 145, and a frequency synthesizer 150. A telephone circuit 160 in the base unit 10 connects this unit to a central office or other appropriate switch through tip and ring lines 101 and 102. An interface unit and display 165 contains the switches and a visual display for configuring the base unit in its various modes for communicating with one of more of the handset units 20 through 40. The transceiver 130 comprises both an RF transmitter and an RF receiver. The transceiver 130 demodulates voice signals transmitted by the handset unit 20 and couples these signals via the D/A section of converter 125 to the telephone circuit 160. The transceiver 130 also has as its input speech and other control signals from the telephone circuit 160. These signals are first coupled through the A/D section of converter 125 before being transmitted to the handset unit 20 by this transceiver 130. The telephone circuit 160 serves as a "plain old telephone service" (POTS) interface for signals on the tip-ring lines 101 and 102 and for those signals received from the handset unit 20 by the RF transceiver 130. Finally a power circuit 170 provides operating power for all of the circuitry in the base unit 10.

The control unit 110 advantageously provides a number of control functions and may be implemented through the use of a microcomputer containing read-only-memory (ROM), random-access-memory (RAM) and through use of the proper coding. Such a microcomputer is known in the art and is readily available from semiconductor manufacturers such as Motorola, Signetics, Intel and AMD. For example, a microcomputer available from Motorola as part number 6805C4 is usable as control unit 110 with the proper programming. A time division duplexer suitable for use as TDD 120 is available from Lucent Technologies Inc. as part number 1000DD.

The control unit 110 generates and stores security code data and also generates pseudo-random seeds from which pseudo-random data lists are generated. Assembly language code for generating such a list in the 6805C4 microcomputer is provided in Appendix 1. It is to be understood that random data lists also may be generated in a pseudo-random manner in accordance with the teaching of S. W. Golomb in *Digital Communications With Space Applications* (New Jersey: Prentice-Hall 1964) pp. 7–15.

In accordance with the illustrative disclosed embodiment described herein, a pseudo-random data list is generated. This generated list has a group of 50 data values which correspond to a set of 50 random channels. All channels are selected from 173 possible channels available in the 902–928 MHz frequency band. This set of 50 random channels is used during a frequency hopping cycle executed by the base unit 10 and one or more associated handset units in accordance with the Federal Communication Commission's General Docket No. 89-354. This same set of channels, or a subset of these channels, also is used during an initialization process described in detail later herein.

The control unit 110 also generates another set of data values from a random number seed. This set of data values, typically 10, corresponds to an additional set of 10 random channels. These channels also are part of the 173 channels available in the 902–928 MHz frequency band. If interference is detected by the base unit or the handset unit with which it is communicating on any one of the set of 50 channels in the frequency hopping cycle, the affected unit initiates a channel change process whereby one or more channels are selected from this additional set of channels for substitution for the channel or channels upon which the interference was detected. As described later herein, when a handset unit serves as a base unit in establishing communications with another handset unit, then the control unit of the handset unit, that is serving as the base unit, takes on the role of generating this extra set of data values. This base unit simulating handset unit communicates a data value to the handset unit with which it is communicating when a channel substitution becomes necessary because of, for example, detected interference on a channel.

The control unit 110 controls and configures the TDD 120. The pseudo-randomly generated data list from the control unit 110 is provided to the TDD 120 where it is stored therein. The TDD 120, in turn, controls the frequencies selected in the frequency hopping cycle of the base unit 10 by inputting into the frequency synthesizer 150 at the appropriate time the values stored in the data list generated by the control unit 110. The TDD 120 also programs the frequency synthesizer 150 as the synthesizer progresses though the frequency hopping cycle.

In order for the base unit 10 to achieve effective coverage throughout its operating range, the signal strength monitor circuit 135 continually monitors the strength of the received signal from the handset unit 20 during ongoing communications with the handset unit 20. This signal strength monitor circuit 135 may be, for example, a received signal strength indicator (RSSI) circuit. This RSSI circuit produces an output voltage that is proportional to the strength of the received signal from the handset unit 20.

Antenna diversity at the base unit is supported for communications between the base unit and one or two handset units. The signal strength monitor circuit 135 monitors the signals received over both antennas 140 and 145 and then selects the antenna having the strongest received signal for the one handset unit that is communicating with the base unit. And when two handset units are communicating with the base unit, the signal strength monitor circuit selects the antenna having the strongest received signal for use with a first handset unit operating in a predetermined first multiple access position and then selects the antenna having the strongest received signal for use with a second handset unit operating in a predetermined second multiple access position. For transmission to the handset units at any given time, only one antenna is used by the base unit. This is determined by the level of transmit power selected by the handset units. If, by way of example, a handset unit is at full power and has the smallest RSSI value, as communicated to the base unit through the opcode signal respectively received from each handset unit, then the base unit selects the particular antenna that will give the best reception for that handset unit.

Responsive to the strength of the received signal from a single handset unit, such as the handset unit 20 as determined by the signal strength monitor circuit 135, the control unit 110 regulates the amount of power transmitted by the transmitter in the RF transceiver 130 to the handset unit 20. Thus, when the handset unit 20 is in close proximity to the base unit 10, the level of power radiated by the RF transceiver 130 is reduced to a minimum acceptable level. And when the handset unit 20 is determined to be located near the fringe of the telephone's operating range, the level of power radiated by RF transceiver 130 is increased to its maximum permitted level.

Responsive to the strength of the received signal from multiple handset units, such as the handset unit 20 and handset unit 30, as determined by the signal strength monitor circuit 135, the control unit 10 regulates the amount of power transmitted by the transmitter in the RF transceiver 130 according to the handset unit having the smallest received RSSI value. Thus, when both the handset unit 20 and 30 are in close proximity to the base unit 10, the level of power radiated by the RF transceiver 130 is reduced to a minimum acceptable level. And when either the handset unit 20 and/or handset unit 30 is determined to be located near the fringe of the telephone's operating range, the level of power radiated by RF transceiver 130 is increased to its maximum permitted level to accommodate the handset unit at the fringe of the telephone's operating range.

Referring next to the handset unit 20, components in this unit include a control unit 210, a wake-up timer 212 and a clock 215 for providing synchronization to: 1) the control unit 210; 2) a time division duplexer (TDD) 220; and 3) a combined digital-to-analog and analog-to-digital (D/A+A/D) converter 225. Also included in the handset unit 20 are an RF transceiver 230, a signal strength monitor circuit 235, an antenna 240 and a frequency synthesizer 250. A telephone circuits and keypad section 260 permits dialing telephone digits and selecting such functions as talk, intercom and page modes for the handset unit 20 to communicate with the base unit 10. An interface unit and display 265 contains switches and a visual display for configuring the handset unit 20 in an appropriate mode for communicating with the base unit 10. A battery 270 provides operating power for all the circuitry in the handset unit 20. This battery is charged by the power circuit 170 via a charge contact interface (not shown) formed when the handset unit 20 is placed in a mating cradle of either the base unit 10 or an auxiliary base unit cradle which has no communication capability. A charge contact interface usable between base unit 10 and handset unit 20 is described in U.S. Pat. No. 5,323,447 which issued to M. E. Gillis et al. on Jun. 21, 1994. As earlier indicated herein, handset units 30 and 40 contain the same components that are in handset unit 20 and are operationally identical.

The RF transceiver 230 comprises both an RF transmitter and an RF receiver. This transceiver 230 demodulates voice signals transmitted by the base unit 10 and couples these signals via the D/A section of converter 225, a hybrid 283, and an amplifier 285 on to a loudspeaker 281. The transceiver 230 also has as its input analog speech signals from a microphone 282 which it transmits to the base unit 10. These analog speech signals are coupled to the transceiver 230 via an amplifier 284, the hybrid 283 and the A/D section of converter 225. This converter converts the analog signal to a digital signal which is then provided to the RF transceiver 230. The signal strength monitor 235 monitors the received signal level from the base unit 10 and accordingly varies the level of the output power radiated by the RF transceiver 230 in proportion to this received signal level.

Any communications between the base unit 10 and the handset unit 20 must be accompanied by a security code then shared between them. During the establishing of initial communications between the handset unit 20 and the base unit 10 initiated by the base unit 10, the control unit 210 must be able to make a favorable comparison of the received security code data with its stored security code data. Similarly, a favorable comparison of the data from the two security codes also must be made by control unit 110 in order for the base unit 10 to respond to a call set-up request from a handset unit. Like the control unit 110, the control unit 210 may be implemented through the use of a microcomputer containing ROM, RAM and through use of the proper coding. Such a microcomputer is known in the art and is readily available from semiconductor manufacturers such as Motorola, Signetics, Intel and AMD. For example, a microcomputer available from Motorola as part number 6805C4 is usable as control unit 210. A time division duplexer suitable for use as TDD 220 is available from Lucent Technologies Inc. as part number 1000DD.

While the handset unit 20 is not being used for communications and is located remote from the base unit 10, the handset unit 20 enters a low power monitoring mode which includes powering down and then powering up certain minimum circuitry in the handset unit 20 as necessary for satisfactory operation. Reducing the on-time state of this circuitry aids in conserving battery power when no communications are in progress between the handset unit and the base unit. Also, other circuitry in the handset unit 20 is turned completely off while the handset unit is in this monitoring mode. In powering down the handset unit 20, the control unit 210 turns itself off or puts itself to sleep and signals the TDD 220 also to turn off while in the powered down state. The control unit 210 also turns off all other clock-driven circuitry in the handset unit 20. After approximately 900 milliseconds, the handset unit 20 is powered up into a minimum power operating state for 100 milliseconds. During the 100 millisecond time period, the control unit 220 turns on and enables the TDD 220, the clock 215 and the receiver portion of the transceiver 230 for determining if an RF signal is being transmitted from the base unit 10 or if a key has been pushed on the keypad in the interface unit and display 265. If neither of these has occurred, the control unit 210 again turns off power to itself and to the TDD 220, and the cycle is repeated. This low power monitoring mode continues as long as an RF signal is not received from the base unit 10 or a key has not been pushed on the keypad.

When an RF signal is received by a handset unit while in its minimum power operating state, this signal is coupled to the control unit 210 which looks for an initialization synchronization (sync) pattern in the signal within the 100 milliseconds that the handset unit is in this state. If the received initialization sync pattern does not contain the security code that is recognized by the handset unit, the control unit 210 turns off power to itself and to the TDD 220. If the initialization sync pattern does contains the security code that is recognized by the handset unit, however, the control unit 210 causes the low power monitoring mode to be overridden. In so doing, the control unit 210 continues to enable the TDD 220 beyond its normal ON time in order to establish synchronization with the RF signal being received from the base unit or a handset unit functioning as the base unit. The low power monitoring mode of the handset unit 20 also is overridden by certain key pushes on the keypad. Once certain predetermined keys are pushed in a certain sequence, as easily programmed, the handset unit 20 is configured in the full ON operate state (the transmitter and receiver in the RF transceiver 230 both turn on) and attempts to establish synchronism with the base unit 10 by transmitting an RF signal to this unit.

With reference to the registration process, this is the process that configures the handset units 20 through 40 for communicating with the base unit 10 or the handset units for communicating with each other. Each of the handset units 20 through 40 must be provided with a security code from the base unit 10 during the registration process in order for subsequent radio frequency communications to take place between the base unit and a handset unit or between handset units.

If only one handset unit is to be used in conjunction with the base unit 10, no manual registration by the user for the single handset unit is necessary. The handset unit and the base unit are both shipped from the factory in a preregistered mode wherein a common security code resulting from a registration process performed in the factory, for example, is employed by both of these units. If a user decides to directly execute the registration process, the transmitted power level from both the base unit and the handset unit are reduced to and provided at a low power level below the lowest normal operating power level during the execution of this process, as described in U.S. Pat. No. 5,463,659 which issued to W. J. Nealon et al. on Oct. 31, 1995. When the telephone is removed from its shipping carton, typically the user installs a battery in the handset unit and cradles the handset unit in the base unit for charging this battery. After the battery has been charged for a suitable time, the user removes the handset unit and goes off-hook either in the phone or the intercom mode.

When the user goes off-hook at the handset unit, the cordless telephone recognizes that it is in the preregistered mode with the common security code stored therein. The security code data for the common security code is generated in the base unit in accordance with the teachings of U.S. Pat. No. 4,736,404 which issued to R. E. Anglikowski et al. on Apr. 5, 1988. The starting channel data is a pseudo-random number seed. This seed, used for generating the starting channel and also random subsequent channels, is generated by the control unit in the base unit in accordance with the assembly language code provided in Appendix 1. The handset unit automatically acknowledges to the base unit when it has received the security code data and the starting channel data. Once this data has been received and acknowledged, both the base unit and the handset unit begin frequency hopping in the manner described in U.S. Pat. No. 5,353,341 which issued to M. E. Gillis et al. on Oct. 4, 1994.

When frequency hopping begins, the transmitted power level is returned to the normal operating power level from the low power level. If subsequent re-registration of the base unit and the handset unit becomes necessary, because of, for example, either the base unit or the handset unit becoming inoperative and having to be replaced, the user may execute the registration process in the manner described in U.S. Pat. No. 5,463,659 and stop the registration process when only the one handset unit has been registered. Also described in U.S. Pat. No. 5,463,659 is a registration process for multiple handset units usable in accordance with the inventive embodiment disclosed herein. The registration process for multiple handset units requires the user to activate a sequence of buttons in the user interface and display 265, shown in FIG. 2, at each handset unit after initiating the registration state at the base unit 10. During the registration process, the base unit 10 transfers common security code data, a unique identifier for each handset unit and also a pseudo-random seed to all of the multiple handset units that are registered in the system.

Figure 11:
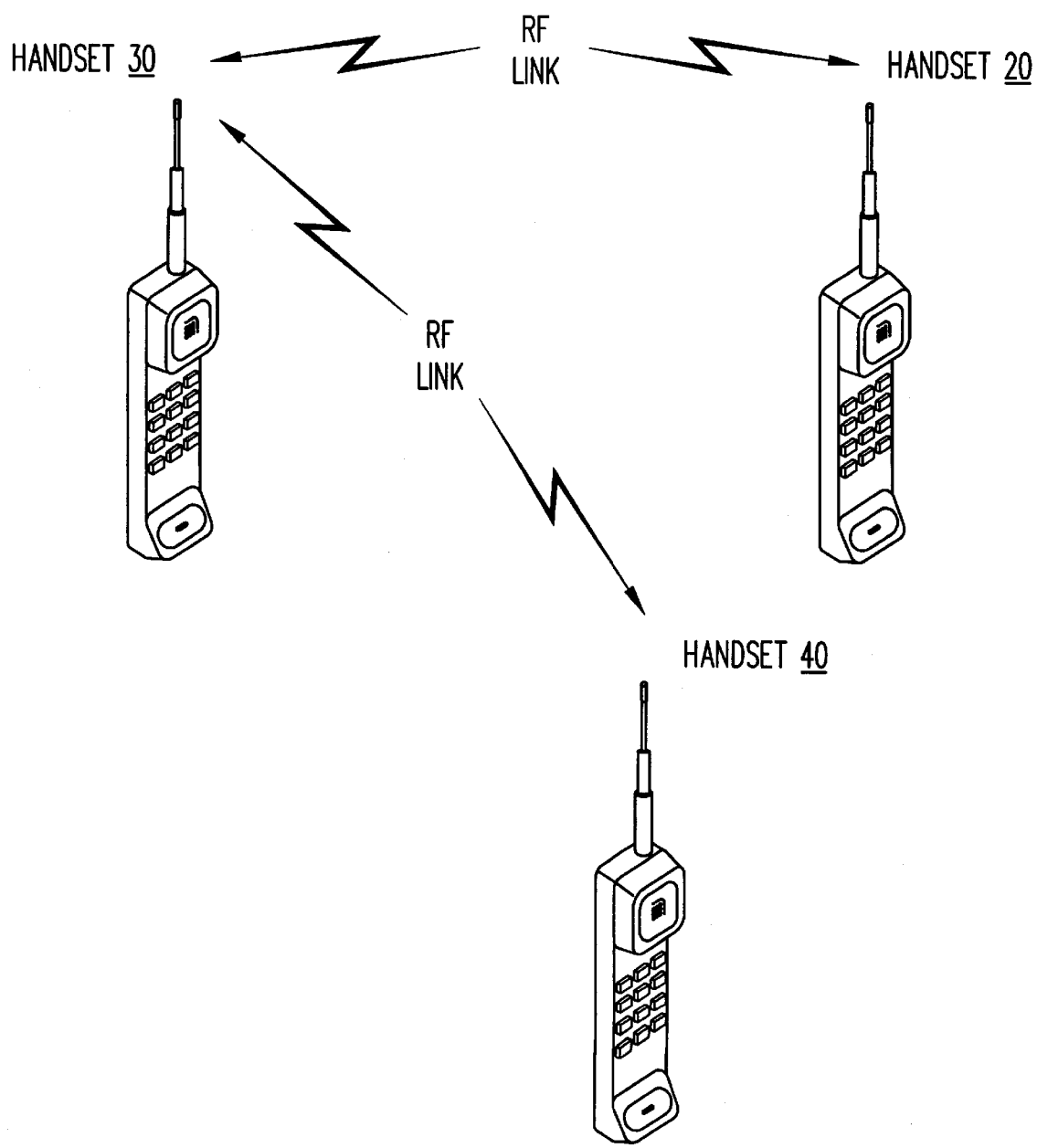
FIG. 11 shows a first, a second and a third portable unit arranged to communicate with each other, in accordance with the principles of the invention.

When multiple handset units are registered with a base unit, any one of the system handset units will have the ability to selectively page and use the intercom with another one or two of the system handset units or the base unit. Such a communications radio-link is illustrated in FIG. 11 which shows handset unit 30 communicating both with handset units 20 and 40.

In accordance with the disclosed embodiment, a physical layer of an air interface is provided by a two channel time division multiple access (TDMA) protocol for supporting a two channel multiple access system. Maximum flexibility in the use of two voice channels is provided. These two channels are considered as virtual channels and not dedicated to any particular telephone line, as in the case of two line telephone products. Also, the use of these channels is fully under the control of control units 110 and 220, which further permits applications that could possibly require the throughput offered by the use of both channels.

In further accordance with the disclosed embodiment, a signaling layer of the air interface is provided by the two channel TDMA protocol for supporting the two channel multiple access system. Two types of subframes, acquisition and traffic, are provided in the air interface for the cordless telephone. The acquisition subframe is a synchronization frame that is configured for fast and reliable symbol and frame timing recovery. Single frame acquisition even in an extreme user hostile environment is achievable. Traffic subframes are those which are used after a communication link has been built and full voice and/or data is interchanged.

Signaling between the base unit and handset units is available during both the traffic mode and the acquisition mode. Between the handset unit and the base unit, signaling in the traffic mode is 6400 b/s and in the acquisition mode 6400 b/s. Between the handset unit and the base unit, signaling in the traffic mode is 6400 b/s and in the acquisition mode 6400 b/s. Additional signaling is available if the voice data channel is used for signaling data. This results in 32 Kb/s additional signaling.

The entire signaling layer of the multiple access system is implemented in the control units, for example, control unit 110 and 210. The control unit 110 and the TDD 120 both support hopping sequences that contain from 2 channels to 128 channels. This is a programmable setting from which the 50 channels in the hopping sequence are selected from the 900 MHz industrial, scientific and medical (ISM) band.

Communications between the base unit 10 and one or two of the handset units 20, 30 or 40 occur in time periods designated as transmission frames. In a frame, the base unit transmits to the handset units and one or two of the handset units transmit back to the base unit. One parameter of the hopping sequence is the duration on a channel. The control unit 110 and the TDD 120 supports, for example, durations of from a width of one frame to 80 frames. A typical transmission frame may be, for example, 5 milliseconds in length, as employed in the disclosed embodiment. In operation, the base unit generally transmits in the first half of each frame or for 2.5 milliseconds and is then reconfigured to receive a signal from either one or two of the handset units which transmit in the second half of each frame or for 2.5 milliseconds on the same frequency. A first handset unit transmits to the base unit in a first portion of the second half of each frame and a second handset unit transmits to the base unit in a second portion of the second half of each frame. As seen in FIGS. 3 through 10, first the base unit 10 transmits in its time slot and contains information both for a USR1 and a USR2 in its 2.5 millisecond time slot.

The handset units operate in complementary fashion to the base unit in that each handset unit receives in the first half of each frame the transmission from the base unit and is reconfigured to transmit either in the first portion or the second portion of the second half of each frame. In the disclosed embodiment, this cyclic frame transmission generates 80 frames in approximately 400 milliseconds with the base unit and handset unit both hopping to and transmitting and receiving on each of the 50 communication channels.

The base unit and the handset units may initiate a call to each other. In the multiple access system for the cordless telephone, no dedicated setup channels are required. All of the channels in the hopping sequence are available as possible setup channels and are used for initiating communications from a handset unit to the base unit as well as in initiating communications from the base unit to the handset units. As a result, the number of handset units in a multiple handset system is virtually unconstrained. Systems of 50 handset units and one base unit are easily achievable without consuming valuable setup channels. Also, the possibility of having setup channels that interfere with communication channels has been eliminated. Details on how channel acquisition is performed are provided later herein.

The transmit frames of the base unit are different from those of the handset units with respect to both the acquisition and traffic frames. Such differences are due to acquisition requirements described later herein for the multiple handset units.

Figure 3:
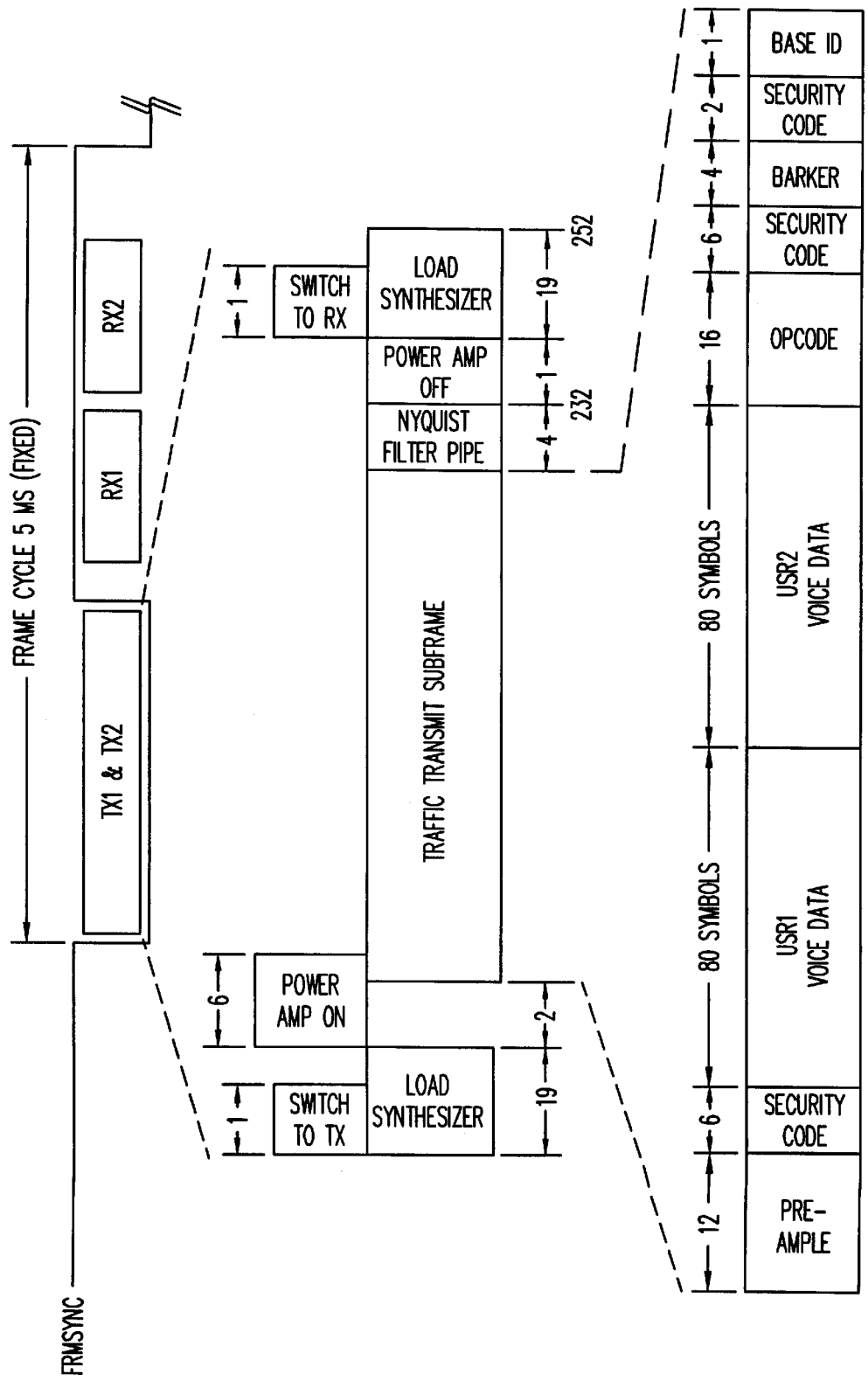
FIG. 3 shows the structure of a base unit transmit subframe arranged in a traffic mode, in accordance with the principles of the present invention.
Figure 4:
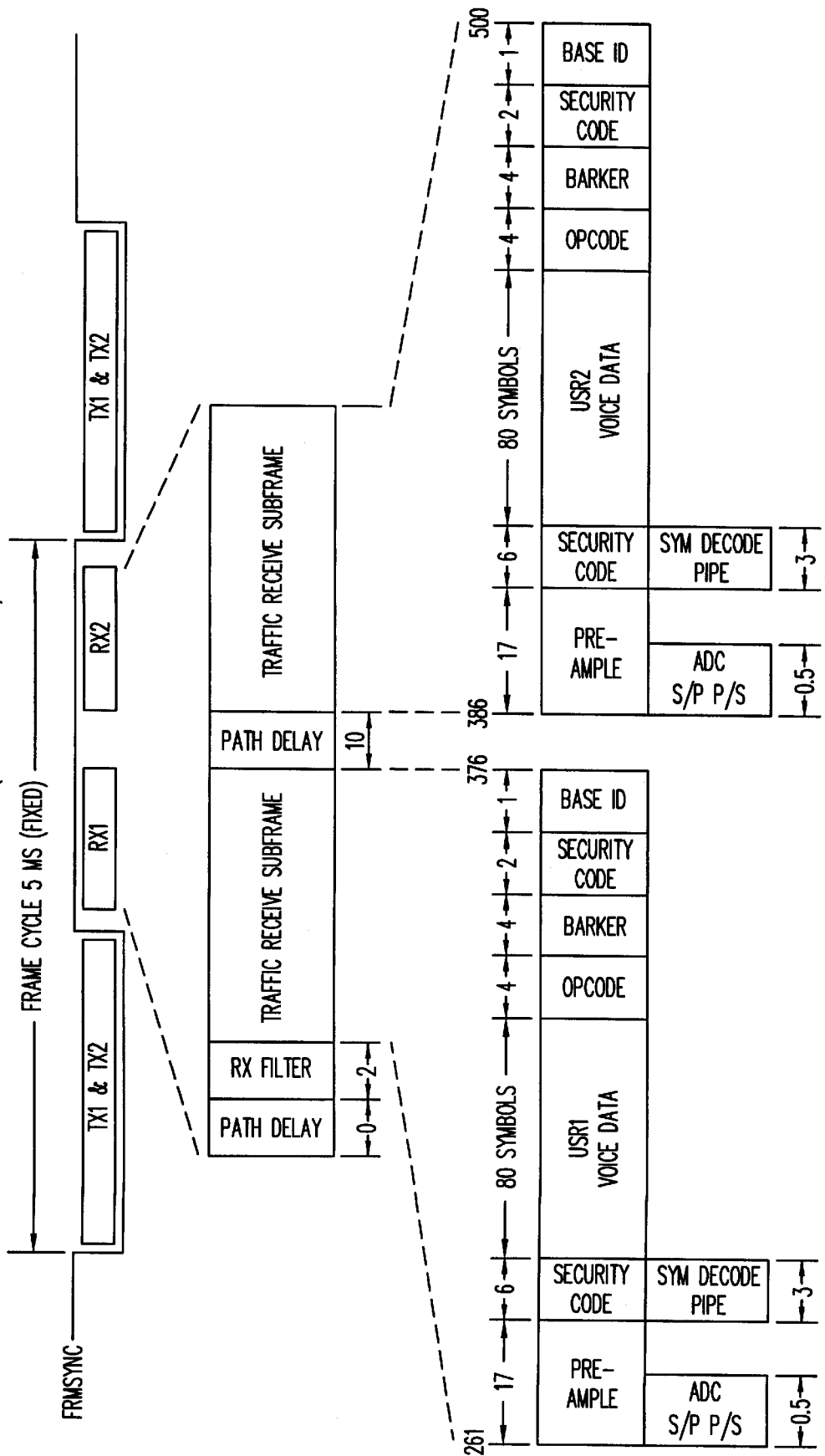
FIG. 4 shows the structure of the base unit receive subframe arranged in the traffic mode, in accordance with the principles of the present invention.

Referring next to FIGS. 3 and 4 in combination, shown are respective diagrams of a base unit transmit subframe structure configured in a traffic mode and a base unit receive subframe structure also configured in the traffic mode. A two channel TDMA multiple access arrangement is used for providing the multiple access operation. The two channels are identified as channel 1 and channel 2 or, alternatively, USR1 and USR2 which are indicative of, by way of example, a first user on channel 1 and a second user on channel 2. There are two 32 Kb/s voice channels, one for each user, and one 6.4 Kb/s signaling channel which is shared between each of the users. Ten symbols of guard time are provided between the USR1 and USR2 receive subframes of the base unit traffic subframe. One system security code is used in the telephone and a base unit identification (ID) is provided which differentiates BigSync detection of another base unit or unrelated handset unit during the acquisition phase.

In general, BigSync is a label for a sequence of known patterns which identifies fields in a frame. More specifically, BigSync indicates frame synchronization by qualifying three parameters: security code; barker code; and unit identification code. The pattern consists of 26 bits constructed as follows: 12 least significant bits (lower 6 symbols) of the security code; 8 bits of the barker code; 4 most significant bits (upper 2 symbols) of the security code; and 2 bits of the base identification code. Each symbol is defined as equal to two bits. The BigSync pattern is received asynchronously and is used to align a receive symbol counter which counts the number of symbols in a frame. As the received symbol counter increments from 0 to 511, it identifies the various fields in the frame.

The requirement for acquisition during a one or two call-in-progress link results in a requirement for receipt of the BigSync pattern during the traffic mode. As a result the lower 6 symbol security code and upper 6 symbol security code are repeated. The lower security code performs as part of the error detection scheme while the upper 6 symbol security code performs as part of the BigSync pattern.

In operation, all of the handset units receive the voice data and opcodes. The handset software of each handset unit is responsible for interpreting the opcode field and selecting the appropriate voice data field.

If the voice channel for either USR1 or USR2 is not in use, then either one of these free channels may be used by the base unit for transmitting an acquisition subframe for, by way of example, adding another handset unit to the communication link. Each handset unit, however, will transmit only in one of the TDMA channels, i.e. either USR1 or USR2 Limiting the transmission for the handset units advantageously reduces power consumption in the handset unit and increases the operating time between charges of the battery in the handset unit.

Figure 5:
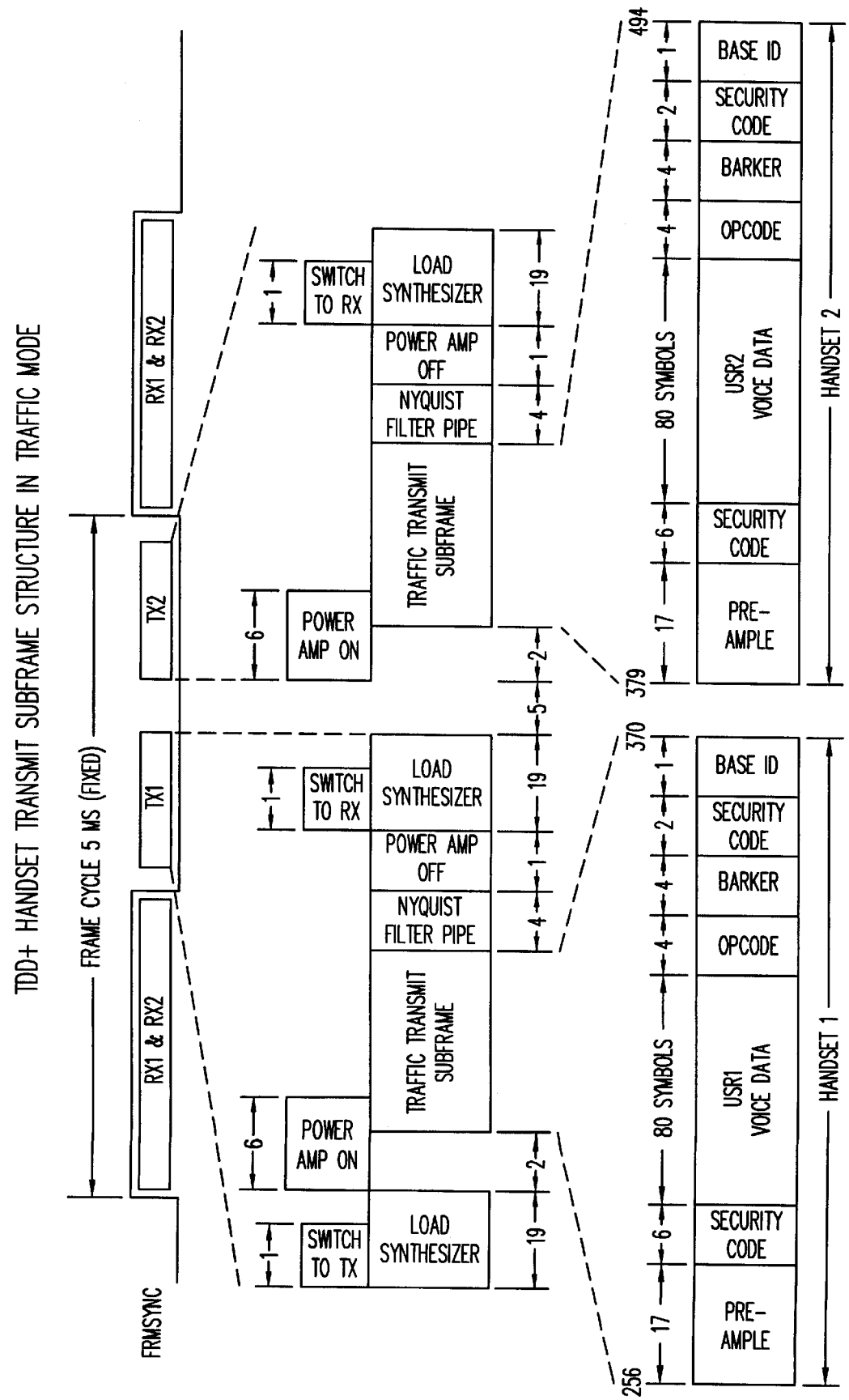
FIG. 5 shows the structure of a portable unit transmit subframe arranged in the traffic mode, in accordance with the principles of the present invention.
Figure 6:
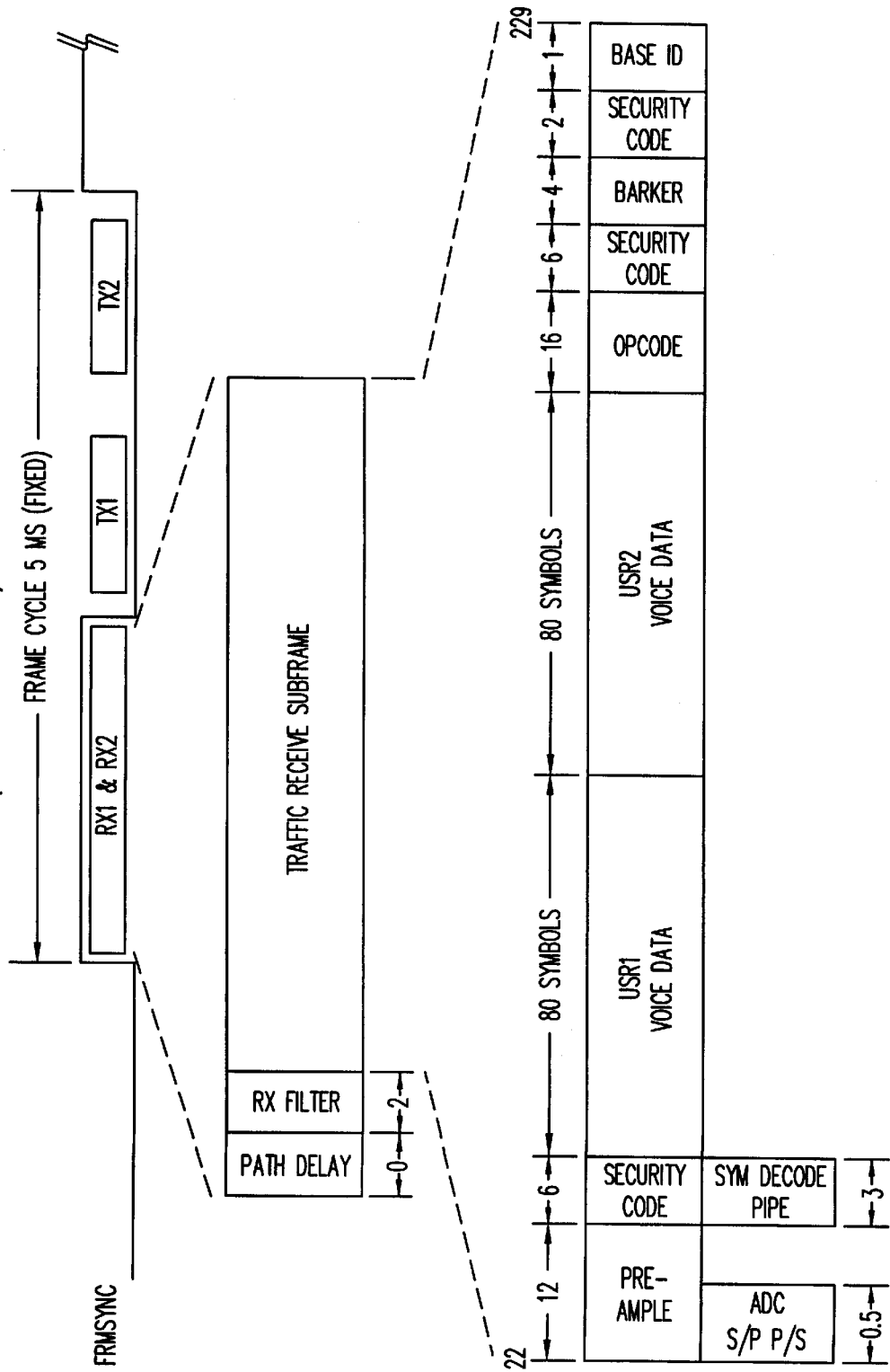
FIG. 6 shows the structure of the portable unit receive subframe arranged in the traffic mode, in accordance with the principles of the present invention.

FIGS. 5 and 6 respectively show diagrams of a handset unit transmit subframe structure configured in the traffic mode and a handset unit receive subframe structure also configured in the traffic mode. The handset unit transmit traffic subframe differs from the base unit transmit traffic subframe in three areas. First, only one voice channel is used by the handset unit, either USR1 or USR2. Second, the opcode from the handset unit is configured to support 1.6 Kb/s signaling to the base unit per user. Lastly, the upper 6 symbol security code is not included while the handset unit is configured in the traffic mode. Other than the differences noted, the remaining fields of the handset unit traffic subframe are identical to the equivalent base unit traffic subframe fields.

Figure 7:
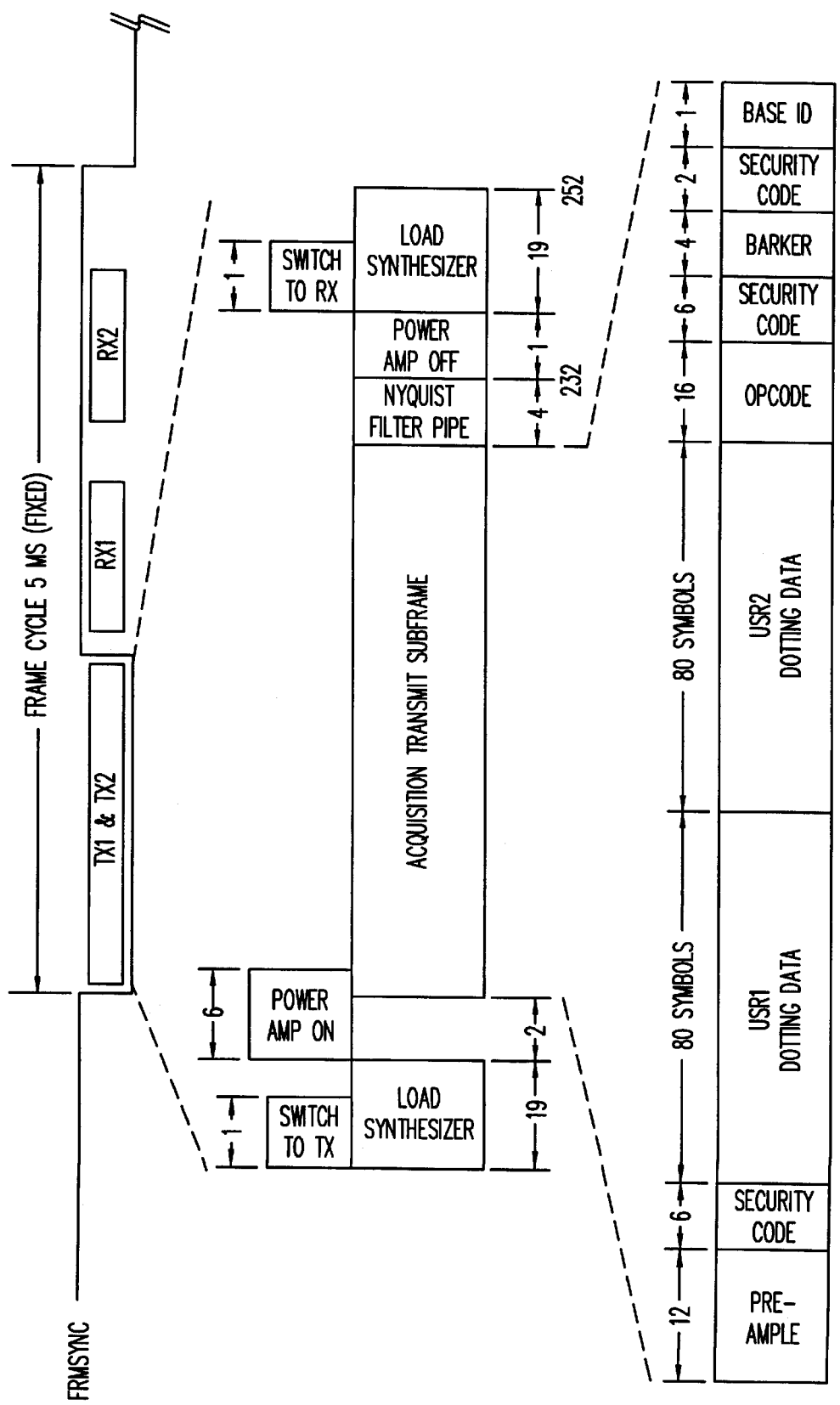
FIG. 7 shows a first embodiment of the structure of a base unit transmit subframe arranged in an acquisition mode, in accordance with the principles of the present invention.
Figure 8:
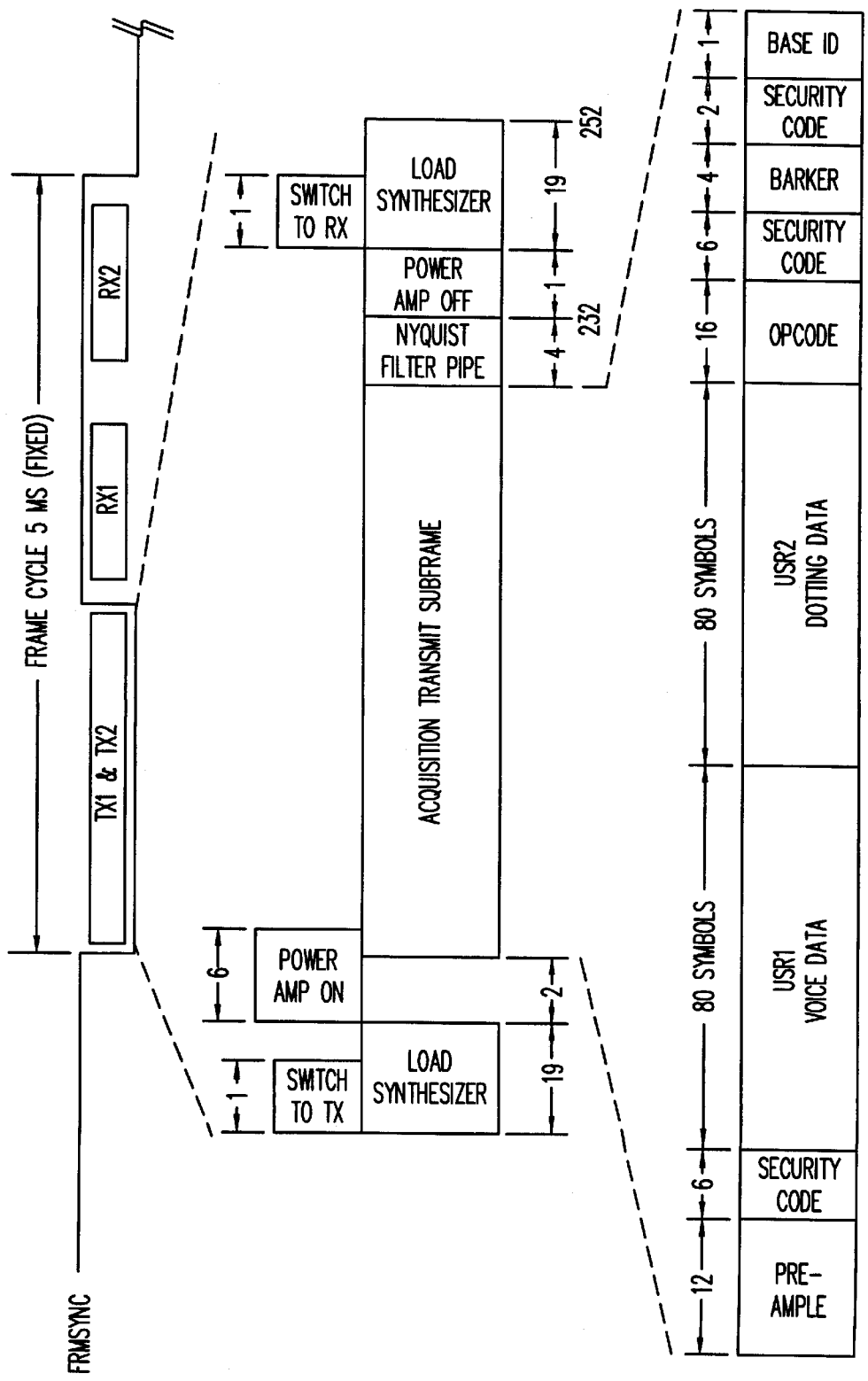
FIG. 8 shows a second embodiment of the structure of the base unit transmit subframe arranged in the acquisition mode, in accordance with the principles of the present invention.
Figure 9:
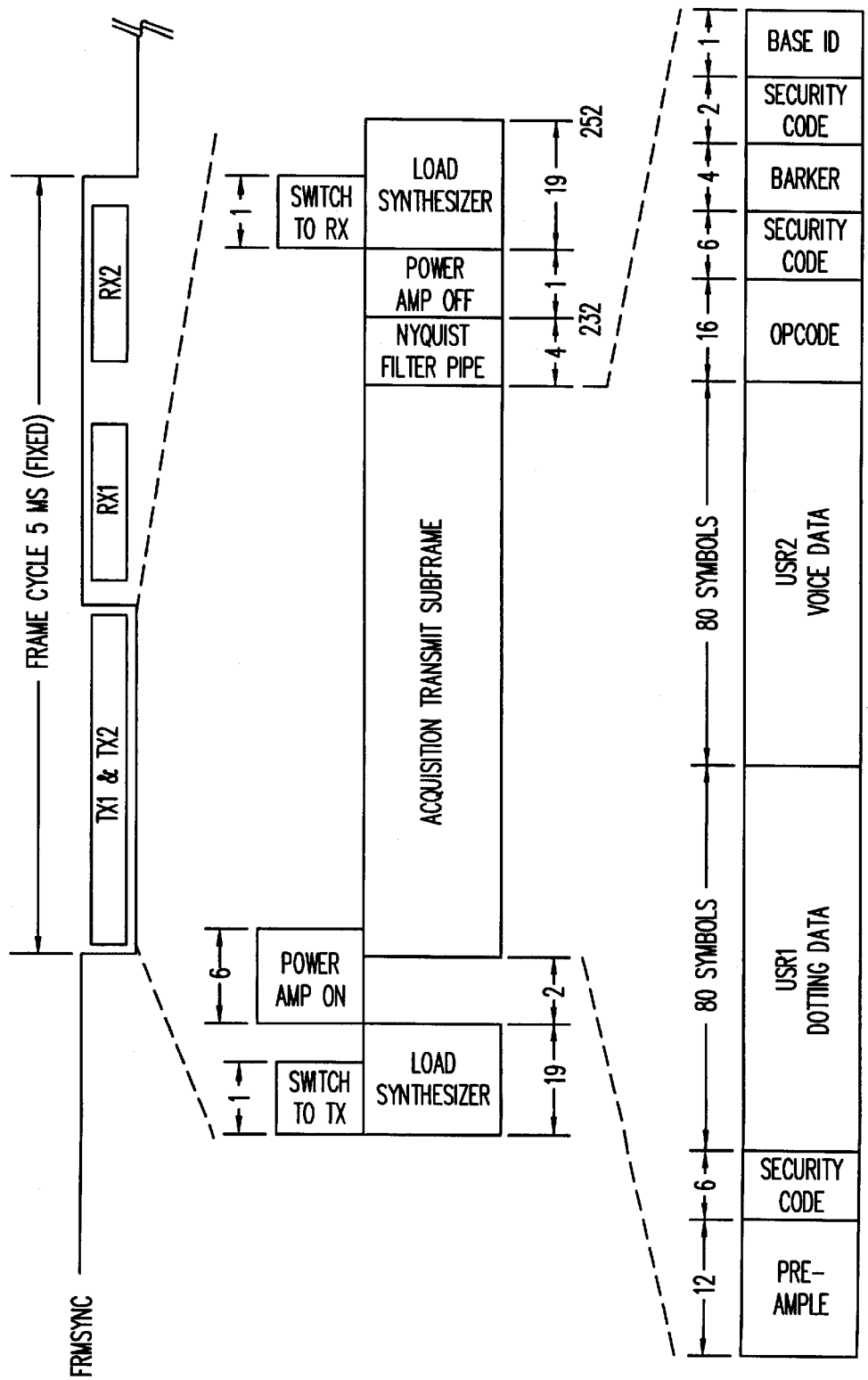
FIG. 9 shows a third embodiment of the structure of the base unit transmit subframe arranged in the acquisition mode, in accordance with the principles of the present invention.

Referring next to FIGS. 7, 8 and 9 in combination, these figures respectively show diagrams of a base unit transmit subframe structure configured in the acquisition mode and a base unit receive subframe structure also configured in the acquisition mode. The base unit transmit acquisition subframe is identical to the base unit transmit traffic subframe except that, in the transmit acquisition subframe, dotting data is inserted in either or both of the voice data channels when these channels are unused.

The diagrams in FIGS. 7, 8 and 9 specifically illustrate the use of both channel 1 and channel 2 as the acquisition subframe or either channel1 or channel 2 as the acquisition subframe. FIG. 7 is an illustration of where communications are not ongoing with the base unit and a handset unit such as when an incoming or outgoing call is first initiated and the communications link must be built. FIG. 8 is an illustration of user voice data being provided on channel 1 and dotting data or synchronizing information being provided on channel 2, such as when a single call is in progress on channel 1 and channel 2 must be used to provide synchronization information. The diagram shown in FIG. 9 is an illustration of when a single call is in progress on channel 2 and channel1 is used to provide the synchronization information. The use of an acquisition subframe, in accordance with the disclosed embodiment, advantageously provides a mechanism for allowing a user at a second handset unit to join a user at a first handset unit on a single channel in progress call by providing synchronization information and the BigSync pattern to the second handset unit.

Figure 10:
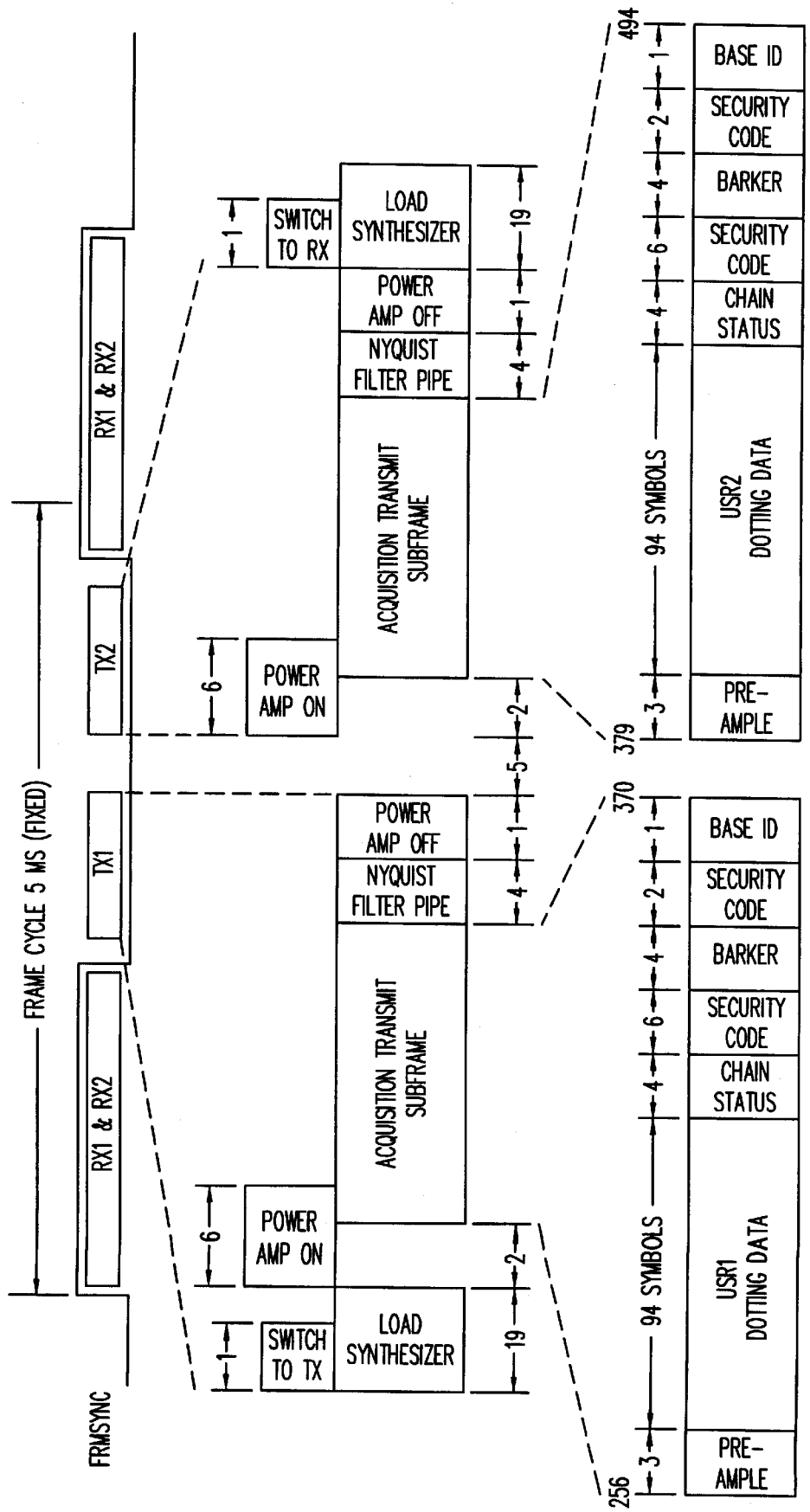
FIG. 10 shows the structure of a portable unit transmit subframe arranged in an acquisition mode, in accordance with the principles of the present invention.

Referring next to FIG. 10, there is shown a diagram of a handset unit transmit subframe structure in the acquisition mode. Specifically, the diagram in FIG. 10 illustrates USR1 and USR2 transmit acquisition subframes. Handset units representative of both USR1 and USR2 are reflected in this diagram. One of these transmit subframes is used by a first handset unit and the other transmit subframe is used by the second handset unit during a call. As shown in FIG. 10, each User has a Chan Status field which is used to transfer signaling information to the base unit during dotting. The bit assignment of this field is four bits, however such assignment may be changed for providing signaling flexibility. If there is no link existing between the base unit and the handset unit, then a handset unit attempting to gain access to the base unit may use both the USR1 and USR2 slots during acquisition subframes. Such operation is described later herein with reference to the flow diagram set forth in FIG. 15.

In order to provide antenna diversity for the cordless telephone, the 17 symbol preamble shown in FIG. 5 is decoded by the base unit and a determination made as to the quality of the signal received from either one handset unit or two handset units. The base unit is thus allowed to sample the RSSI signal from both antennas 140 and 145, shown in FIG. 2, and then select the antenna with the strongest signal. This process is performed first for USR1 and then for USR2. Through this process, independent antenna selection is provided for each received voice channel.

When the base unit 10 is initiating a call to the handset unit 20, for example, the base unit sends the initialization synchronization pattern on a channel, in the frequency hop routine for 2.5 milliseconds. When the handset unit is initiating a call to the base unit, the handset unit also sends this same initialization synchronization pattern in a time period equal to the second part of each frame, or for 2.5 milliseconds. This synchronization pattern comprises a dotting sequence signal, followed by a security code, barker code and a period in which no information is transmitted as discussed later herein.

The dotting sequence signal is a series of ones and zeros that are provided for either the handset units, or the base unit 10, to align the phase of its receive clock with the phase of the clock providing the incoming signal. When the phases of these clocks are aligned, the handset unit is then able to read in the proper bit boundary the security code and barker code that follow the dotting sequence signal.

When attempting to contact the handset unit, the base unit sends two sets of 94 symbols of the dotting sequence with each set being followed by 4 symbols of signaling, followed by 13 symbols of the BigSync pattern. This security code is a 16-bits random number generated by the base unit and, as earlier indicated, is transferred to the control unit 210 in the handset unit 20 over a low power radio-link during the registration process which registers the multiple handset units used in the system. This shared security code guards against another base unit inadvertently synchronizing with the handset units that are registered within the system.

The lower security code is followed in the initialization synchronization pattern by the barker code which, in turn, is followed by the remaining upper security code. This barker code is a fixed predetermined eight-bit pattern which provides a position reference in a frame for aligning a symbol counter of the receiver in the handset unit with the symbol counter of the transmitter in the base unit. This permits the handset unit 20, for example, to reestablish frame sync or frame phase with the base unit 10 when the handset unit experiences a deep fade or similar RF interruption. When aligning with the handset unit 20, a symbol counter in the receiver of the base unit 10 must similarly be aligned with a symbol counter of the transmitter in the handset unit.

After the base unit 10 transmits the security code, barker code and base identification code in the initialization sync pattern, no additional information is sent by the base unit in each frame for a time period equal to 602 bits. A delay is provided in this time period for receiving USR1 and USR2 fields and certain internal processing to occur, including, for example, the reconfiguring of the frequency synthesizer 150, shown in FIG. 2, for receiving the initialization sync pattern from the handset unit 20.

Once the alignment of the frame position of the handset unit receiver with the base unit transmitter has been achieved, synchronization or BigSync for the handset unit is established. Similarly, the alignment of the frame position of the base unit receiver with the handset unit transmitter also establishes BigSync for the base unit.

Although a regular or normal frequency hopping sequence is described herein, it is to be understood that, a "slow hop" frequency hopping sequence also may be used in the multiple access protocol for the cordless telephone. A slow hop frequency hopping sequence is a frequency hopping sequence having durations greater than one frame. For example, a duration of four frames may be used in the multiple access protocol for the cordless telephone. It is to be further understood that slow hop frequency hopping sequences also may have durations of a greater or lesser number.

The multiple access protocol for the cordless telephone employs a pseudo synchronous system for system synchronization. Although a synchronous system is highly desirable because of ease of implementation and it requires less complex algorithms, such a synchronous system would, unfortunately, require a regular beacon signal from the base unit. Moreover, in order to guarantee synchronization, a beacon rate in the order of seconds or minutes would be required. Such a beacon is therefore viewed unfavorable because of excessive spectral noise content and random distribution issues.

As an alternative to a fully synchronous system, the pseudo synchronous system Is provided. In the operation of this system, an attempt to resynchronize whenever a communication link is built is attempted. All of the handset units sense the communication link and adjust for the new information. If by chance, some of the handset units are shadowed from the base unit signals and if the link is torn down before the shadowed handset units receive the signal energy the system will contain a mix of synchronized and unsynchronized handset units, which are referred to as orphan handset units. When these orphan handset units once again receive the signal energy, however, they also will be successful in link acquisition.

A low power monitoring mode is also employed in the cordless telephone. In this mode, wherein the handset units monitor the 50 hopping channels for a base unit broadcast command, a sniff cycle for the handset unit is set at, for example, one second. The handset unit cycle is adjusted so that the next sniff cycle occurs on the next hopping channel of the 50 channel hopping channel sequence. This procedure assures that the handset unit will cycle through all 50 of the hopping channels guaranteeing the availability of 50 different setup channels. In this manner, interfered setup channels are avoided.

Although the sniff cycle may be set at one second, in order to provide longer standby and talk times, a variable sniff cycle also may be implemented. Such a adaptive power cycle for a cordless telephone is described in U.S. Pat. No. 5,519,762 which issued to R. A. Bartlett on May 21, 1996. With this approach, each handset unit has a variable sniff cycle which depends on that handset unit's specific usage. Thus, each handset unit in the system adjusts its sniff cycle based on the length of time since it last communicated with the base unit or another handset unit. By way of example, if the handset unit's last contact with the base unit (or another handset unit) was greater than four hours, then the sniff cycle would be extended to, by way of illustrative example, two seconds or optionally three seconds. Sniff cycles up to five seconds are acceptable.

In the event that an interferer appears on one or more of the 50 hopping channels, those one or more channels experiencing the interference are substituted for in the manner disclosed in U.S. Pat. No. 5,323,447 which issued to M. E. Gillis et al. on Jun. 21, 1994.

The substitute channel information is made available to all of the handset units in the system through 6400 b/s signaling from the base unit to the handset unit.

Broadcast signaling also is available to all the handset units in the system through the base unit to handset unit 6400 b/s signaling in the 32 bit opcode field. This includes up to two handset units simultaneously communicating with the base unit on the communication link and the sleeping handset units of the system. The signaling information is partitioned such that USR1 and USR2 signaling requirements are satisfied in addition to any broadcast information requirements, e.g. caller ID information or telephone answering system (TAS) message waiting information. In addition to this, advanced hopping channel information is also broadcast to the handset units of the system as required so that channels that are no longer in use as part of the frequency hop cycle may be avoided.

Other examples of a broadcast message are ringing information and handset unit contention resolution information provided during receipt of an incoming call. A large amount of flexibility is available in implementing a broadcast messaging scheme ranging from dedicated bits in each frame to time sharing of the available bandwidth between several frames, e.g. first frame for USR1, second frame for USR2, and third frame for broadcast message.

The base unit frame structure is well suited for broadcast messaging and allows for the handset units of the system to determine the state of the system. One of the states of the system is when one of the system's handset units requires a link for an outgoing call, or intercom and page, and there are no voice channels available. When such is the case, the base unit informs the requesting handset unit that all of the voice channels are occupied and the requesting handset unit notifies the user that the base unit is busy.

In accordance with the disclosed embodiment, a frequency scanning process, described in detail later herein, scans the hopping channels starting at the channel with the highest probability of detection, or some channel in the hop cycle before or after this channel, in order to compensate for synchronization misalignment. The scan proceeds as if the hopping sequence was being traversed. The difference is that the duration of the channels in the hopping sequence is 300 $\mu$s instead of 5 ms. The key to this scanning process is a high performance method of detecting BigSync on the channels of the hopping sequence.

During the scanning process, the RSSI energy of the received signal is qualified by a minimum measured threshold appearing on each of the hopped to channels and stored in one of six correlation tables, for determining the correlation coefficient. Correlation coefficients are known and may be generated in accordance with the teaching of John G. Proakis and Dimitris G. Manolakis in *Digital Signal Processing Principles, Algorithms, and Applications* (New York Macmillan Publishing Company 1992) pp. 111–126. At the end of the scan process, two sets of tables are developed with each set consisting of 3 tables, and each of the 6 tables, three from each set, consists of 50 elements, one element for each of the measured and qualified RSSI values. The control unit develops a correlation coefficient for each element in one set of tables and retains the element with the highest correlation value. The same process is then repeated for the second set of tables. At this point, the control unit selects the one of the two correlation coefficients having the highest value, which represents a frequency position in the hopping sequence at which to start hopping and perform the acquisition process by detecting BigSync. The remainder of the acquisition process is then performed by the applicable control unit.

Handset units may advantageously be configured to communicate with other handset units, in accordance with the disclosed embodiment. A first handset unit, for example, handset unit 20 can have its circuitry, i.e., its TDD 220 reconfigure such that this circuit will cause the handset unit 20 to transmit and receive in the same manner as the base unit 10. Simply put, this "walkie talkie" mode is when one handset unit talks to a second handset unit. The handset unit performing as the base unit can support both voice channels, and therefore may talk to up to two other handset units.

The walkie talkie mode can be performed by a handset unit without any special considerations if the base unit is not already communicating on a communication link. On the other hand, because of the synchronization requirement and the absence of specific setup channels, when the base unit is already communicating over a link, the walkie talkie mode can not be initiated by another handset unit without some special considerations. By definition, the handset units of the system must scan the required 50 hopping channels of the ISM 900 MHz band system. Thus, the handset unit that performs as a base unit initiates a hopping channel sequence that is identical to the base unit's but displaced in time such that the scanning sequence of the sleeping handset units of the system will encounter the signal energy from the handset unit performing the base unit page first before the signal energy from the actual base unit. The communication link with the sleeping handset units is then established with the handset unit performing the base unit page and not the base unit.

The advantage of the hopping channel sequence, that is displaced in time as described herein above, for the walkie talkie mode is that it becomes possible for another handset unit pair to establish still another walkie talkie communication link. This scenario may be extended for any number of handset unit pairs.

A communication link, established between the base unit and handset units, may either be a single link between the base unit and only one other handset unit in the system, or two links between the base unit and any two handset units in the system.

For incoming calls, or intercom and pages, the base unit initiates the process of building a communication link. In the implementation of the telephone, the process involves setting up the base unit's two channel acquisition subframe with the dotting mode in both voice channels, as shown in FIG. 7, and immediately have the base unit start frequency hopping. The base unit starts the hopping sequence on a channel in the sequence that provides the highest probability of quick detection by the handset units. Such arrangement is feasible when the accuracy between the clocks in the base unit and handset units are kept in synchronism with each other. Such synchronism may be provided for example, by calibration, high accuracy crystals (temperature compensated or laser trimmed) and beaconing. As indicated herein above, the sniff cycle of each of the handset units are configured such that a new channel of the hopping sequence is "sniffed" on each progressive sniff cycle. This method ensures that a handset unit will not miss a broadcast signal from the base unit by continually listening on a channel that contains interference.

When the handset units wake up, these units detect BigSync transmitted by the base unit, or handset unit simulating the base unit, on the channel in the acquisition subframe. The 32 bit opcode field of the acquisition frame contains broadcast information for all of the handset units in the system, e.g., a ring opcode. At this point, the base unit is hopping and dotting until one, or two, of the handset units answer the incoming call. Up to this point all of the handset units are only listening and none have communicated back to the base unit. In order to permit one or two of the handset units to signal to the base unit that a person at one or two units are attempting to answer the call, a method of handset contention resolution is employed by the base unit, in accordance with the invention, to prevent more than two handset units from attempting to respond at the same time.

The handset contention resolution is provided through use of a polling process wherein the base unit polls each of the handset units. In the operation of this polling process, the base unit transmits an opcode that requests the status for each of the known handset units in the system, one at a time. This is achievable since each handset unit of the system has a unique identification code that was assigned to the handset unit during registration with the base unit. Both voice channels are used in order to facilitate the process. The exact number of frames required for the handshake is determined by the number of handset units registered with the base unit. Typically, the base unit will send a message and receive a response from a handset unit in two frames. Thus, the handshaking generally requires from 4 to 6 frames per handset unit, allowing for base unit receive frame acquisition and a level of message redundancy. When the handset unit responds back to the base unit, it responds by providing a service request acknowledge signal in the 8 bit Chan Status field in the transmit acquisition subframe. Once the base unit has ascertained the status of each of the contacted and responding handset units, it waits until a user-initiated, link acquisition request from a contacted handset unit is received before allocating a voice channel to this contacted handset unit. The messaging dialogue is illustratively performed via the handset unit transmit acquisition subframe as shown in FIG. 10. Once the base unit has allocated both voice channels, the other handset units in the system receive a broadcast message that the base unit is busy.

Handset units operating in the cordless telephone system also may initiate outgoing calls, an intercom or page call. The knowledge of the sleep cycle for each of the handset units assists the base unit in scanning the frequency hopping channels for outgoing calls, or intercom and page calls. The base unit uses the same scanning technique used by the handset units to detect BigSync. Handset contention resolution is also performed for outgoing calls. Each handset unit of the system is assigned a unique set of equally spaced acquisition channels.

Each handset unit in the system is assigned its own unique set of setup channels so that during link acquisition, collisions between handset units are avoided. By way of illustrative example, if there are 12 handset units in the cordless telephone system, then each handset unit may be assigned four unique acquisition channels distributed across the active or in use 50 frequency hopping channels which only the assigned handset unit may use in attempting to contact the base unit. Those channels that are assigned to handset unit #1 may be, illustratively channel 1, channel 13, channel 25 and channel 37. Extending the acquisition channel assignments to handset unit #2 results in channel assignments of channel 2, channel 14, channel 26 and 38 for this handset unit. This same process is repeated in assigning acquisition channels for each of the remaining handset units in the system such that handset unit #12 would have channel assignments of channel 12, channel 24, channel 36 and channel 48. If there are more or less handset units then more or less setup channels are assigned. Also, the initial set of setup channels are the preferred channels and additional channels are available in the event that one or more of the initial setup channels become corrupted by signal energy from another signal source appearing on these channels.

A typical scenario of an outgoing call is as follows. The handset unit is awakened out of the sniff cycle by the user pressing the phone button. On one of the four designated frequency hopping channels, the handset unit next transmits an acquisition subframe for four hopping frames in both voice channels and then turns off its transmitter. When the time for the next designated handset unit acquisition channel of the hopping sequence occurs, as determined by the internal clock in the handset unit, the handset unit again transmits an acquisition subframe for four hopping frames in both voice channels and again turns off its transmitter. This process continues until the base unit responds. Typically, the first four hopping frame transmissions are all that is required for acquisition.

Once the base unit detects BigSync, the transmitted message and the 8 bit Chan Status field, the base unit is configured for receiving the two channel acquisition subframe from the handset unit, as shown in FIG. 10, with dotting data in both voice channels. The base unit then immediately start hopping based on the information in the handset unit message. The process is nearly identical to the acquisition method for an incoming call, as described herein above. The one exception is that handset unit polling is not required.

Once a communication link has been established between the base unit and only one of the handset units in the system, the remaining voice channel is available for another handset unit. The base unit makes this available channel known to the other handset units by dotting in the unused voice channel in preparation for another handset unit joining the link. If the base unit needs to have a second handset unit join the link, as in the case of an incoming call on the other line of a two line telephone, the base unit sends a broadcast message to the sleeping handset units in the system. The message may be directed to ringing or some other state of the system and includes which voice channel is available. When the sleeping handset units wake up, they receive the broadcast message and perform the required function, e.g., activate the handset unit ringer. The base unit polls the handset units of the system in order to determine when one of the handset units is attempting to answer the incoming call.

When the base unit identifies a second handset unit to join the communication link established between the base unit and a first handset unit, the second handset unit obtains synchronization through the dotting sequence of the second unused voice channel of the base unit. Once this second handset unit becomes synchronized then this handset unit transmits an acquisition subframe to the base unit using the predefined acquisition channels described herein above.

The broadcast message capability of the base unit also permits the simultaneous acquisition of both lines in a two line phone system when two incoming calls appear simultaneously. The broadcast message may indicate the receipt of simultaneous incoming calls and all the handset units in the two line phone system start ringing and indicate calls on both line 1 and line 2. It is possible in this scenario that both lines may be answered simultaneously by two individual handset units. Both handset units also may support servicing line 1 or servicing line 2 or obviously each handset unit may be dedicated to servicing a particular line, e.g., line 1 or line 2. Finally, it is possible to support conferencing wherein one handset unit may answer and communicate over both lines simultaneously.

Figure 12:
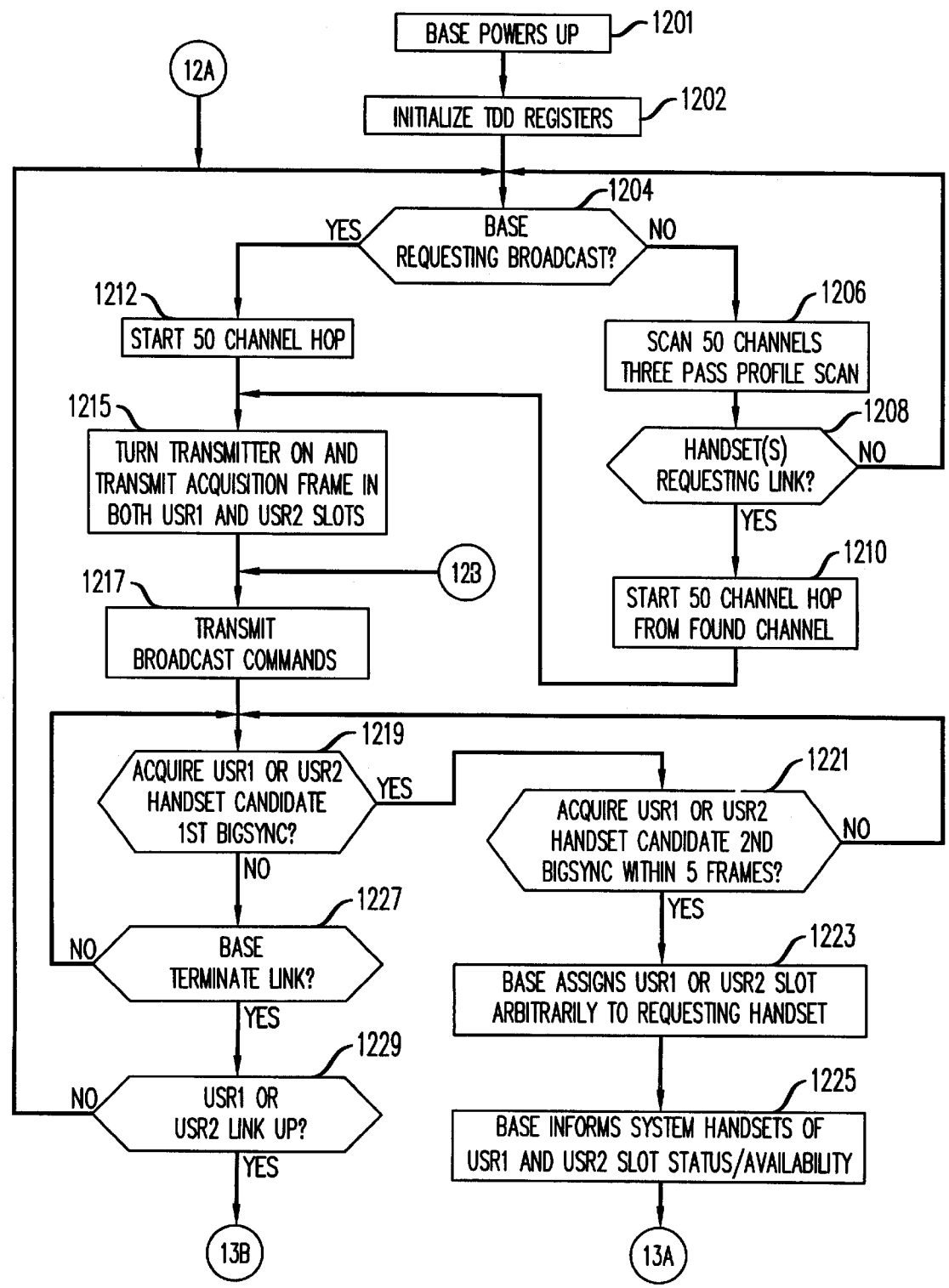
FIGS. 12 through 14 show the protocol of the cordless telephone depicting the specific processes executed by the base unit in performing a base station link acquisition of the portable unit or units during a power-up state, in accordance with the principles of the present invention.
Figure 13:
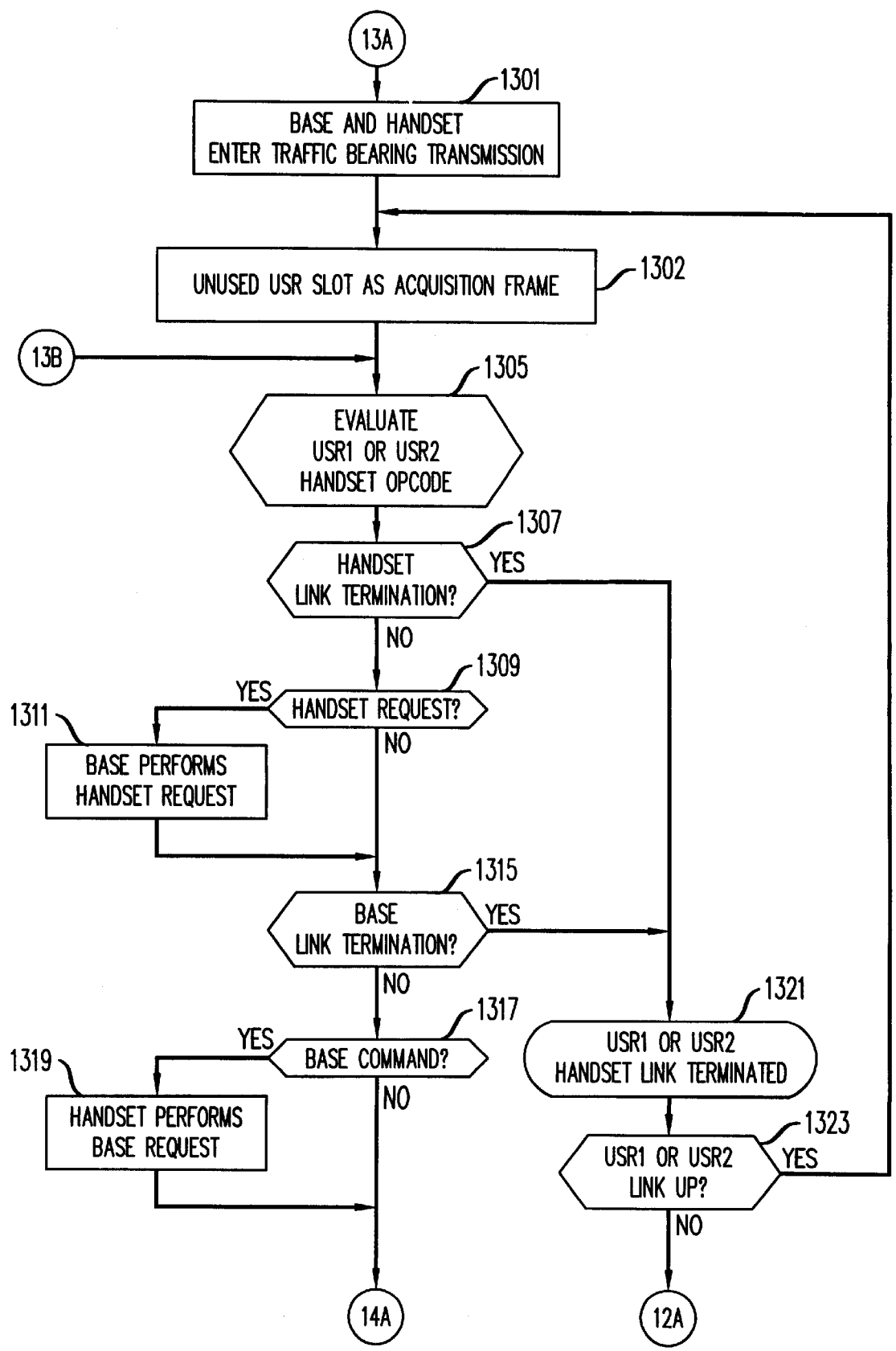
Figure 14:
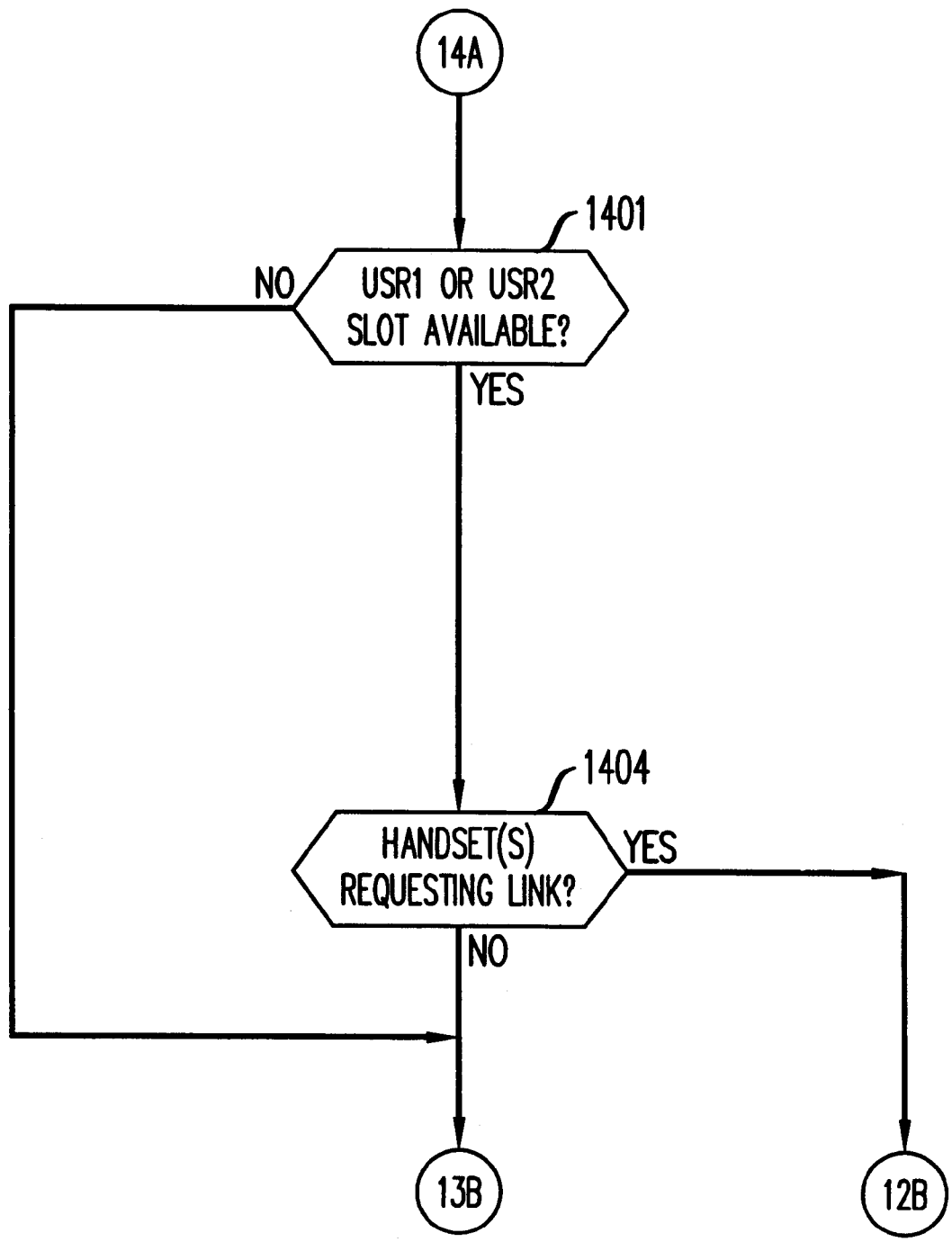

Referring next to FIGS. 12 through 14, in combination, there is shown a protocol of the cordless telephone depicting the specific processes executed by the base unit in performing a base station link acquisition of the handset unit or units during a power-up state, in accordance with the disclosed invention. The functions provided by control unit 110 are advantageously determined by a process or program stored in read-only memory (not shown) associated with this unit.

Figure 22:
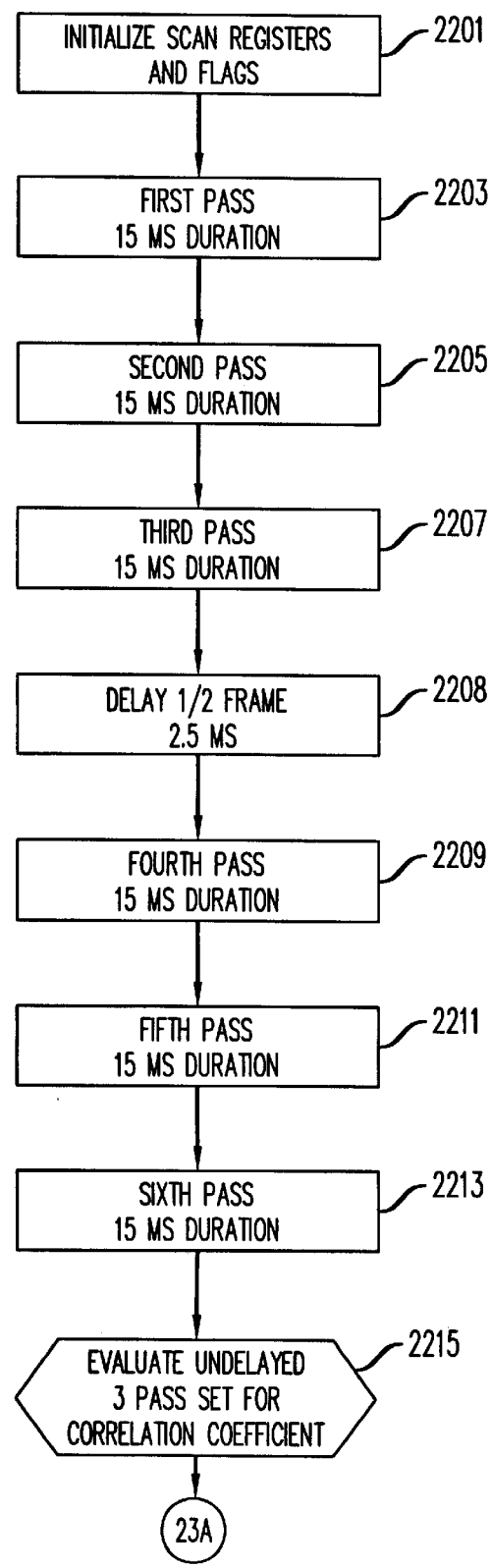
FIGS. 22 through 24 depict a first protocol of specific processes executed by the base unit and/or the multiple portable units in performing a link acquisition, in accordance with the principles of the present invention.
Figure 23:
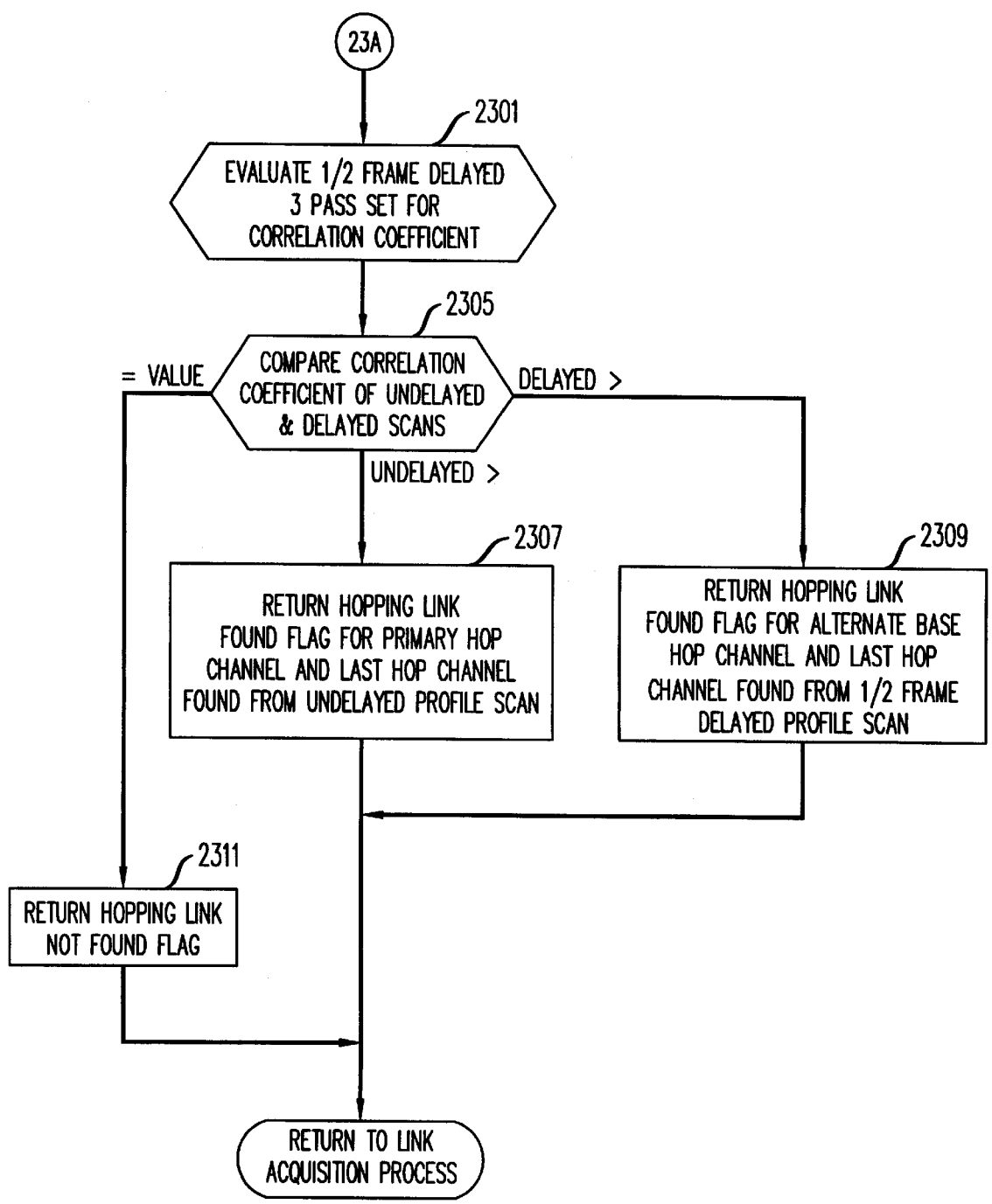
Figure 24:
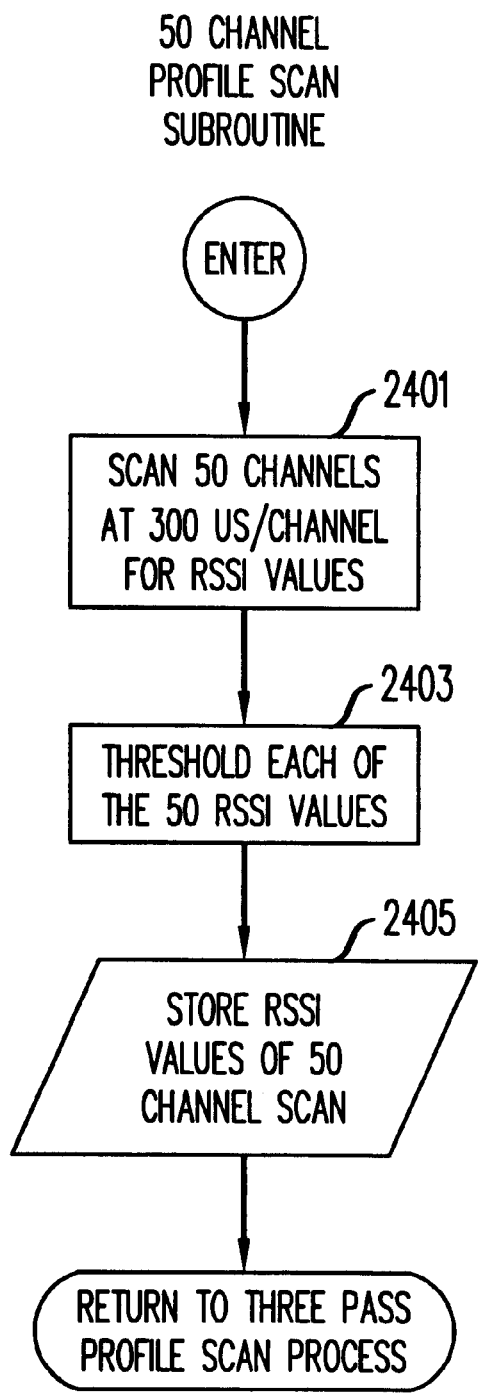

The process is entered at step 1201 where operating power is initially applied to the base unit such as when it is first installed in a premises. As the base unit is powered up to its operating state, both the security code and the seed are retrieved from memory and the registers of the TDD 120, as shown in FIG. 2, are initialized with the 50 hopping channels, as reflected by step 1202. From step 1202, the process advances to decision 1204 where a determination is made as to whether a broadcast signal to the handset unit or units is being made by the base unit. If not, the process advances to step 1206 where the base unit uses a three pass profile scan to scan in 15 milliseconds per scan all of the 50 channels in the frequency hopping sequence. In this three pass profile scan, as illustrated in FIGS. 22, 23 and 24, and described in detail later herein with reference to these figures, the base unit examines each one of the 50 channels in the frequency hopping sequence for signal energy to determine if one of the handset units is attempting to contact the base unit If it is determined at decision 1208 that a handset unit has not requested that a communication link be established, the process returns to the decision 1204 and this monitoring loop is repeated until signal energy indicative of a handset unit requesting the communication link is detected. Once this signal energy is detected at decision 1208, the process advances to step 1210 where the 50 channel frequency hop is started from the found channel. From step 1210, the process advances to step 1215 where the base unit's transmitter is turned on and an acquisition subframe transmitted in both USR1 and USR2 slots.

If at decision 1204, a determination is made that the base unit should generate a broadcast signal to the handset units, the process advances to step 1212 where the base unit begins to hop among the 50 channels in the frequency hopping sequence. Responsive to an internal clock (not shown) in the base unit, this 50 channel hop is begun on a channel which is generally indicative of which frequency the base unit would have just hopped to had it maintained its last existing communication link. Such an arrangement is achieved by employing precision internal clocks in the base unit and the handset units. Thus, when the base unit and the handset units become active and/or look for signal energy over the 50 channels, such energy is easily found since the internal clocks of the base unit and the handset units remain very close to each other, in view of the very small frequency drifts due to variations in the oscillators in the internal clocks. As a result, synchronization between the base unit and one or two handset units is quickly and easily achieved.

From the step 1212, the process advances to the step 1215 wherein the acquisition subframe, which permits the handset unit to link up with the base unit, is provided. From the step 1215, the process advances to step 1217 wherein the base unit transmits its broadcast commands. Broadcast commands are those that allow the handset units to determine the state of the system. By way of example, if the base unit receives an incoming call and is generating a ringing signal, this ring signal is provided as a broadcast message to the handset units. Another example of a broadcast command is when all the voice channels are busy, the base unit provides this channel-busy information to other handset units in the system which might otherwise attempt to contact the base unit.

From step 1217, the process advances to decision 1219 where a determination is made as to whether BigSync is being received from a handset candidate, i.e., is one of the handset units attempting to contact the base unit and has the base unit been able to synchronize with the BigSync signal being received from this handset unit. If so, the base unit then terminates reception of this BigSync signal and attempts to acquire BigSync for a second time in decision 1221. By attempting to synchronize with the handset unit for a second time, the base unit minimizes the possibility of receiving the wrong signal from a handset unit. If in decision 1219, the base unit does not acquire BigSync and the base unit does not terminate the link, the process remains in the loop determined by decisions 1219 and 1227. If the base unit terminates the link, as determined by decision 1227, the process advances to decision 1229 where if the previous link had been established, then the decision is made to keep active the existing link with another handset unit on the then in use USR1 or USR2 slot. If there is no other handset unit on the link, the base unit then returns to decision 1204.

Referring once again to decision 1221, if the base unit acquires the second BigSysc in this decision, the process advances to step 1223 where the base unit assigns either the USR1 or the USR2 slot to the requesting handset unit. The base unit then informs the system handset units of its slot/status availability, as reflected in step 1225. From step 1225, the process advances to step 1301 where the base unit and the contacted handset unit enter the traffic mode, as described earlier herein, and the unused USR slot, if available, is configured as an acquisition subframe for an additional handset unit that subsequently attempts to contact the base unit. From step 1302, the process advances to decision 1305 wherein the opcode of the contacted handset unit is evaluated and either determined to be correct wherein access is granted or determined to be incorrect and access is denied.

From decision 1305, the process advances to decision 1307 where the status of the link between a handset unit and the base unit is monitored. If the link between the handset unit and the base unit has been terminated, then the process advances to step 1321 wherein it is specifically determined whether the link for USR1 or USR2 was terminated. The process then advances to the decision 1323 for determining whether a communication link exist in the remaining slot, i.e., USR1 if the link for USR2 was terminated or USR2 if the link for USR1 was terminated. If so, the process then returns to the step 1302 where the unused USR slot is then used as an acquisition subframe.

If the handset link has not been terminated in decision 1307, then the process advances to decision 1309 where it is determined if any requests have been generated by the handset unit then communicating with the base unit over the communication link. If so, the base unit performs the one or more requests in step 1311. From step 1311 and, if there are no requests, from step 1309, the process advances to decision 1315 where it is determined if the base unit link has been terminated. If so, the process advances to step 1321. If not, the process advances to decision 1317 where it is determined if any requests have been generated by the base unit. If so, the handset unit performs the one or more requests in step 1319. From step 1319 and, if there are no requests, from step 1317, the process advances to decision 1401 where a determination is made as to whether the USR1 or the USR2 time slot is available for a handset unit to establish communications with the base unit. If a handset unit is requesting a communication link be established with the base unit, as determined by decision 1404, the process returns to step 1217 where the base unit transmits its broadcast commands to the handset unit. If there are no slots available, as determined in decision 1401, and if a handset unit is not requesting that a communication link be established with the base unit, then the process returns to decision 1305 to evaluate and perform further USR1 and USR2 opcodes and/or base commands. Once the base unit is powered up, the acquisition link process is continually performed by this unit. In the execution of this process, the base unit continually cycles among the steps and decisions described above for recognizing and establishing communications over a communication link with one or two handset units from among a plurality of associated handset units.

Figure 15:
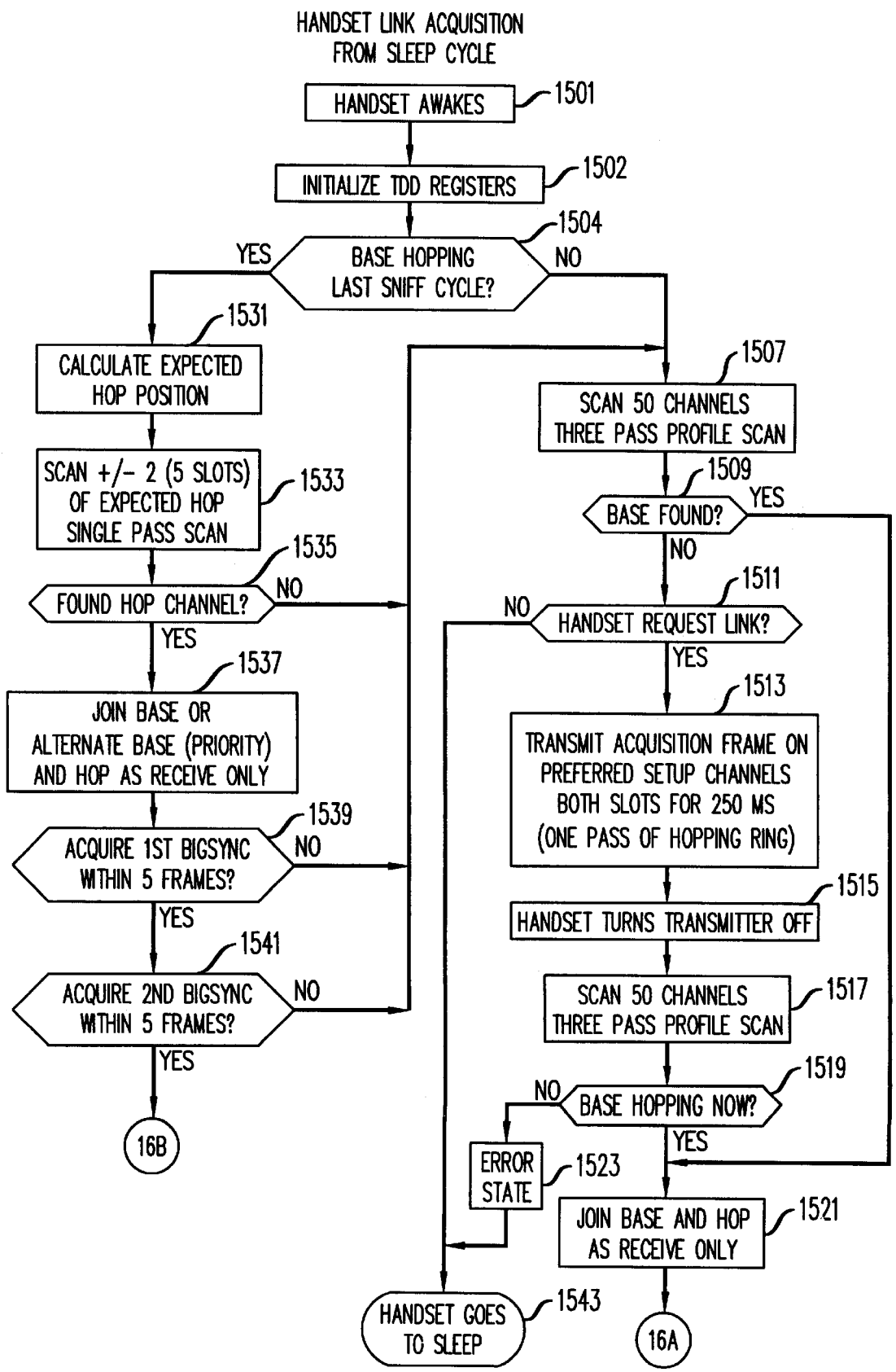
FIGS. 15 through 17 show the protocol of the cordless telephone depicting the specific processes executed by one of the multiple portable units in performing a portable unit link acquisition from a sleep cycle, in accordance with the principles of the present invention.
Figure 16:
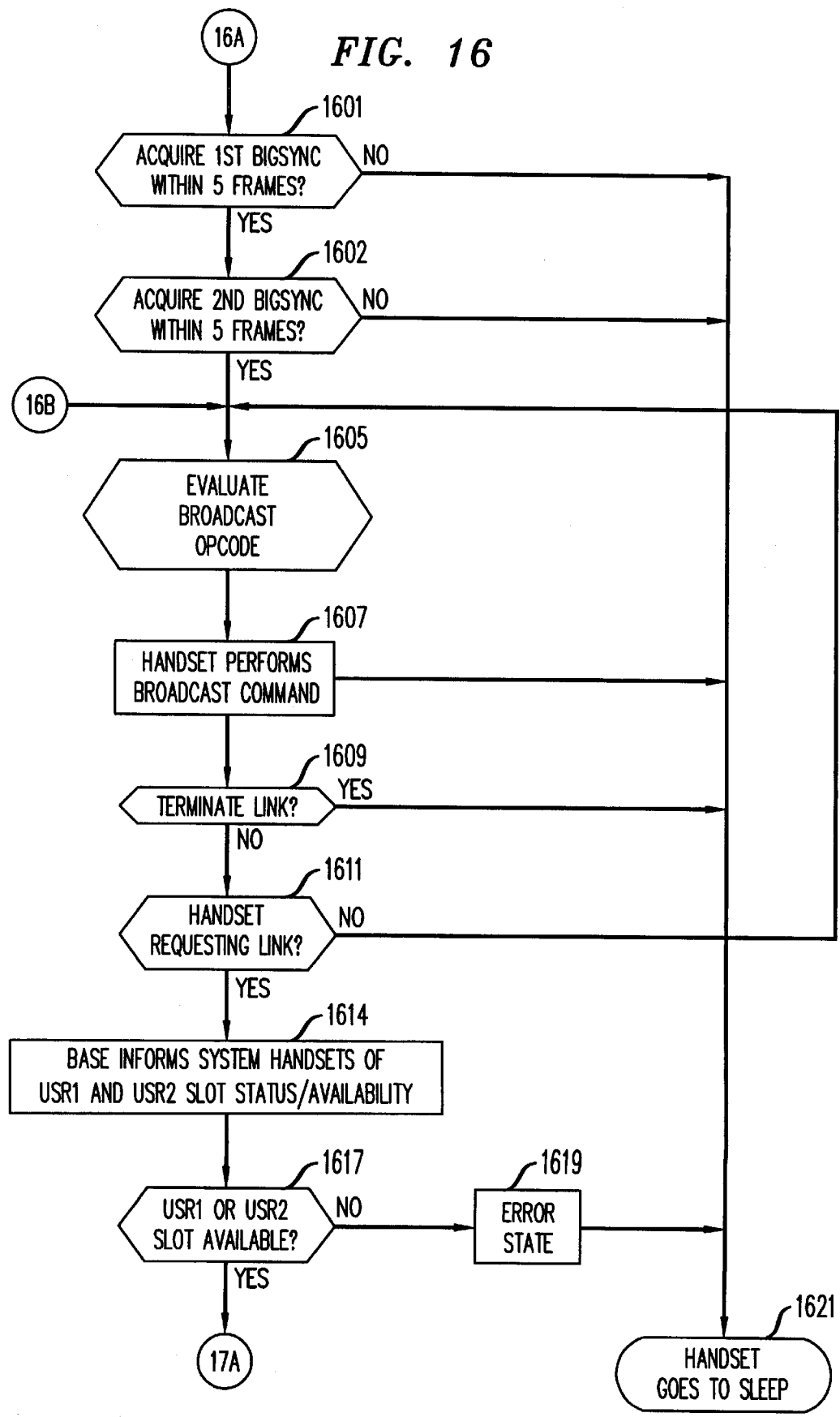
Figure 17:
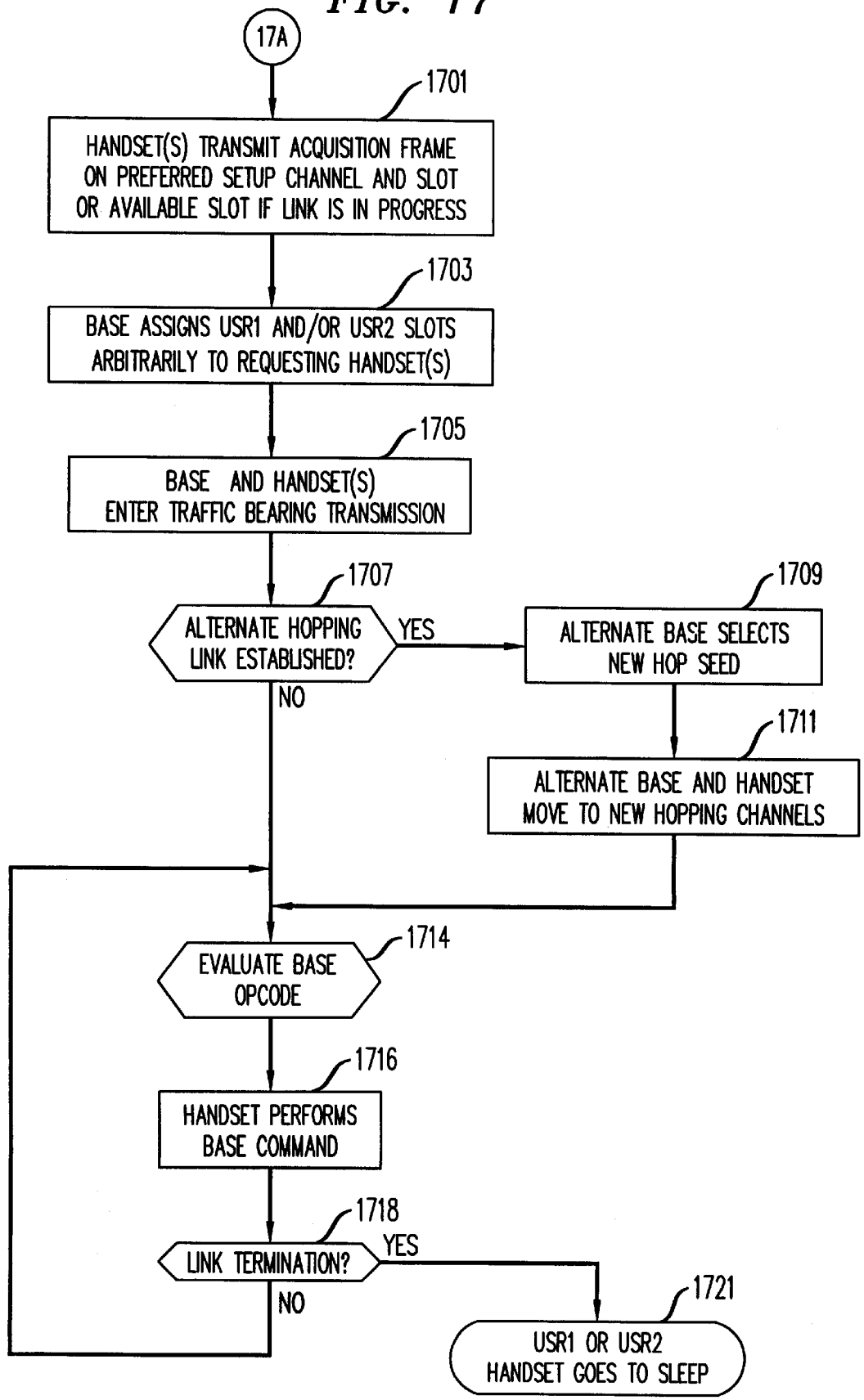
Figure 18:
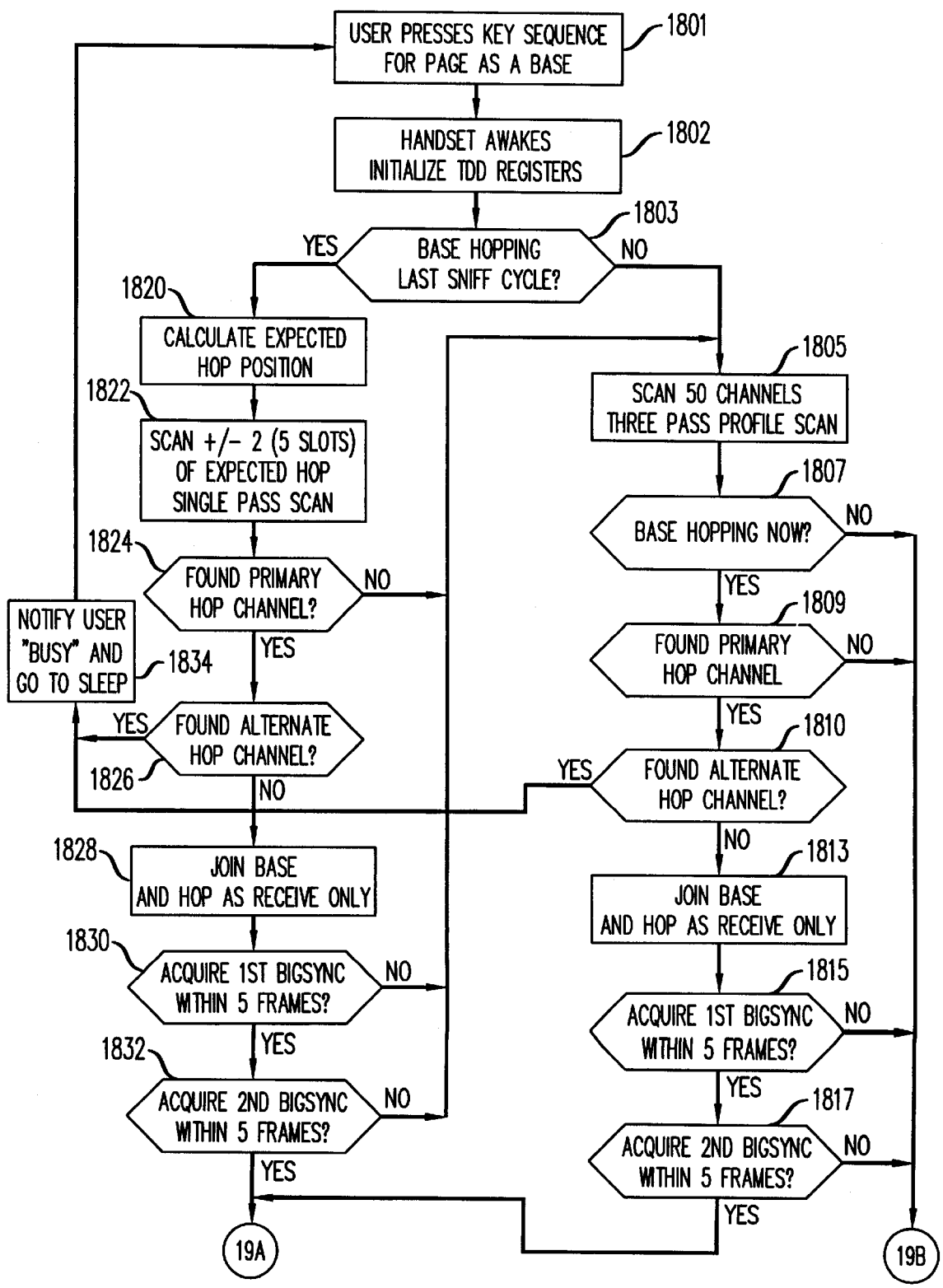
FIGS. 18 through 21 show the protocol of the cordless telephone depicting the specific processes executed by one of the multiple portable units in performing a portable unit to portable unit link acquisition from a sleep cycle, in accordance with the principles of the present invention.
Figure 19:
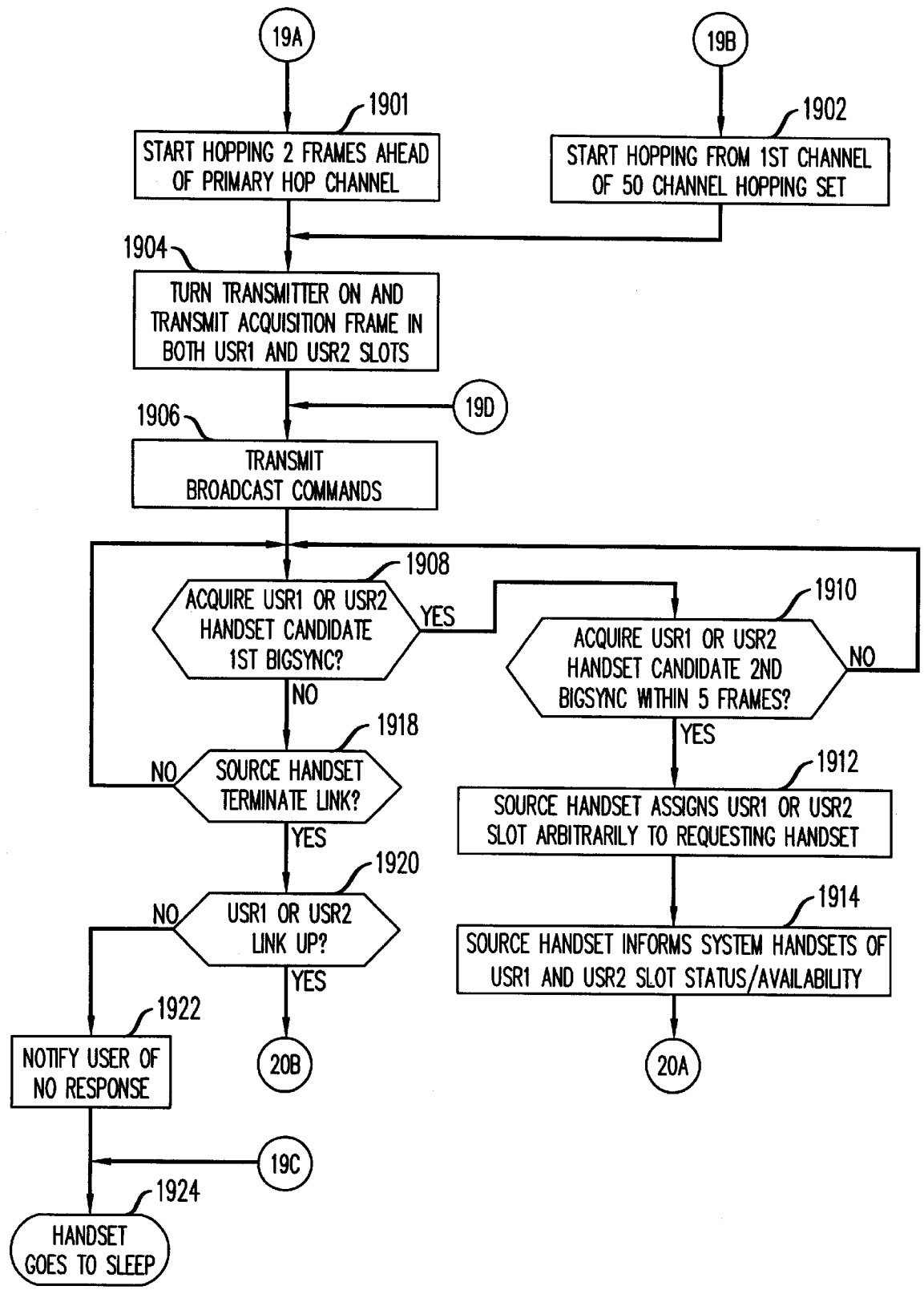
Figure 20:
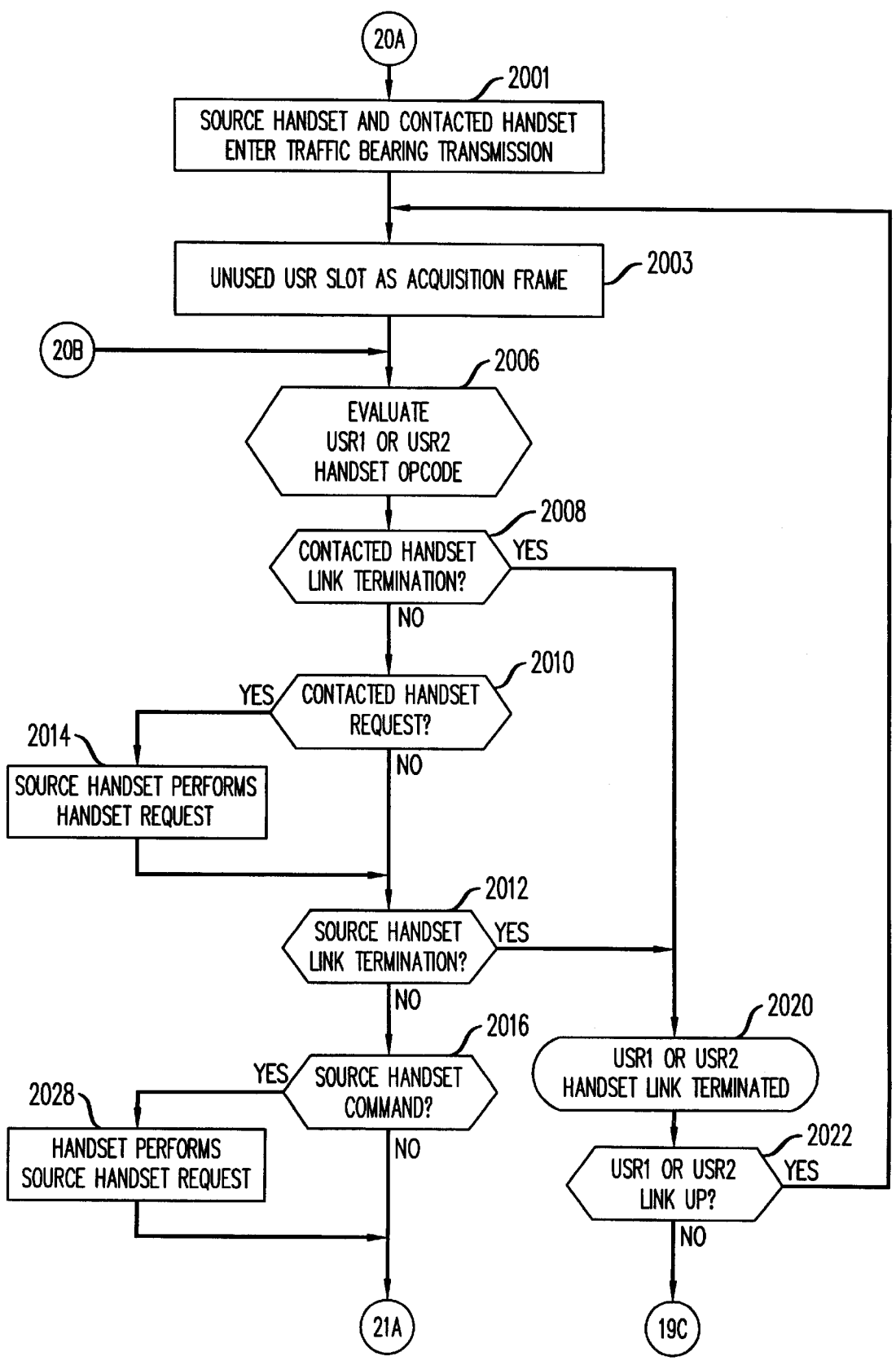
Figure 21:
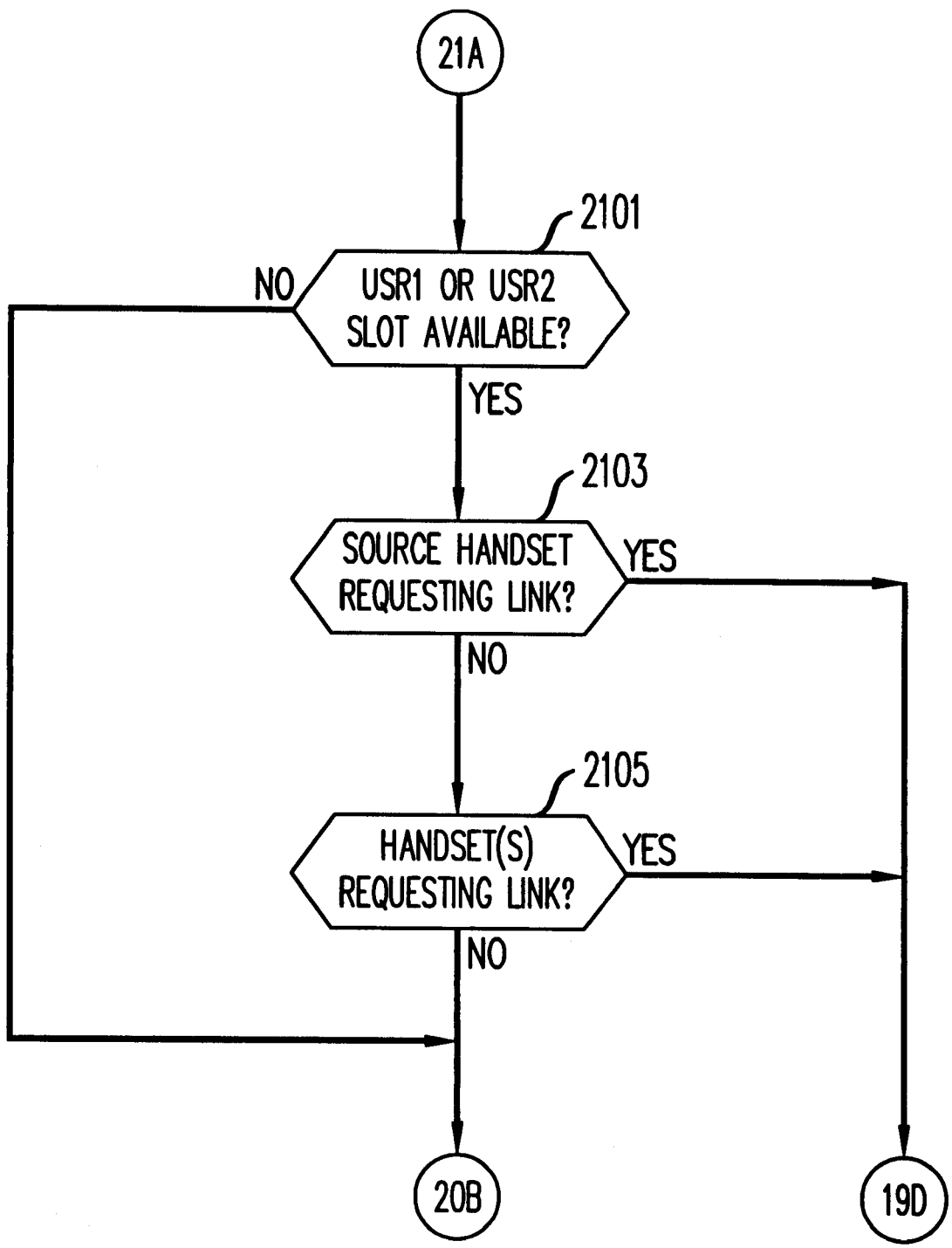

Referring next to FIGS. 15 through 17, in combination, there is shown a protocol of the cordless telephone depicting the specific processes executed by the handset unit or units in performing a handset unit link acquisition of the base station unit during the sniff on portion of the sniff cycle, in accordance with the disclosed embodiment. The functions provided by control unit 210, in achieving the described protocol, is determined by a process or program stored in read-only memory associated with this control unit. The process is entered at step 1501 where operating power is applied to the handset unit when it first enters the sniff on, or awakening, portion of the sniff cycle. As the handset unit is powered up to its operating state, the security code and the seed are retrieved from memory and the registers of the TDD are initialized with the 50 hopping channels, as reflected by step 1502. From step 1502, the process advances to decision 1504 where a determination is made as to whether the base unit was hopping before the handset unit went to sleep in the previous sniff cycle. If not, the process advances to step 1507 where the handset unit uses the three pass profile scan to scan each one of the 50 channels in the frequency hopping sequence. In this three pass profile scan, as illustrated in FIGS. 22, 23 and 24 and described in detail later herein, the handset unit quickly examines each one of the 50 channels in the frequency hopping sequence for signal energy to determine if the base unit is attempting to contact the handset unit.

Figure 25:
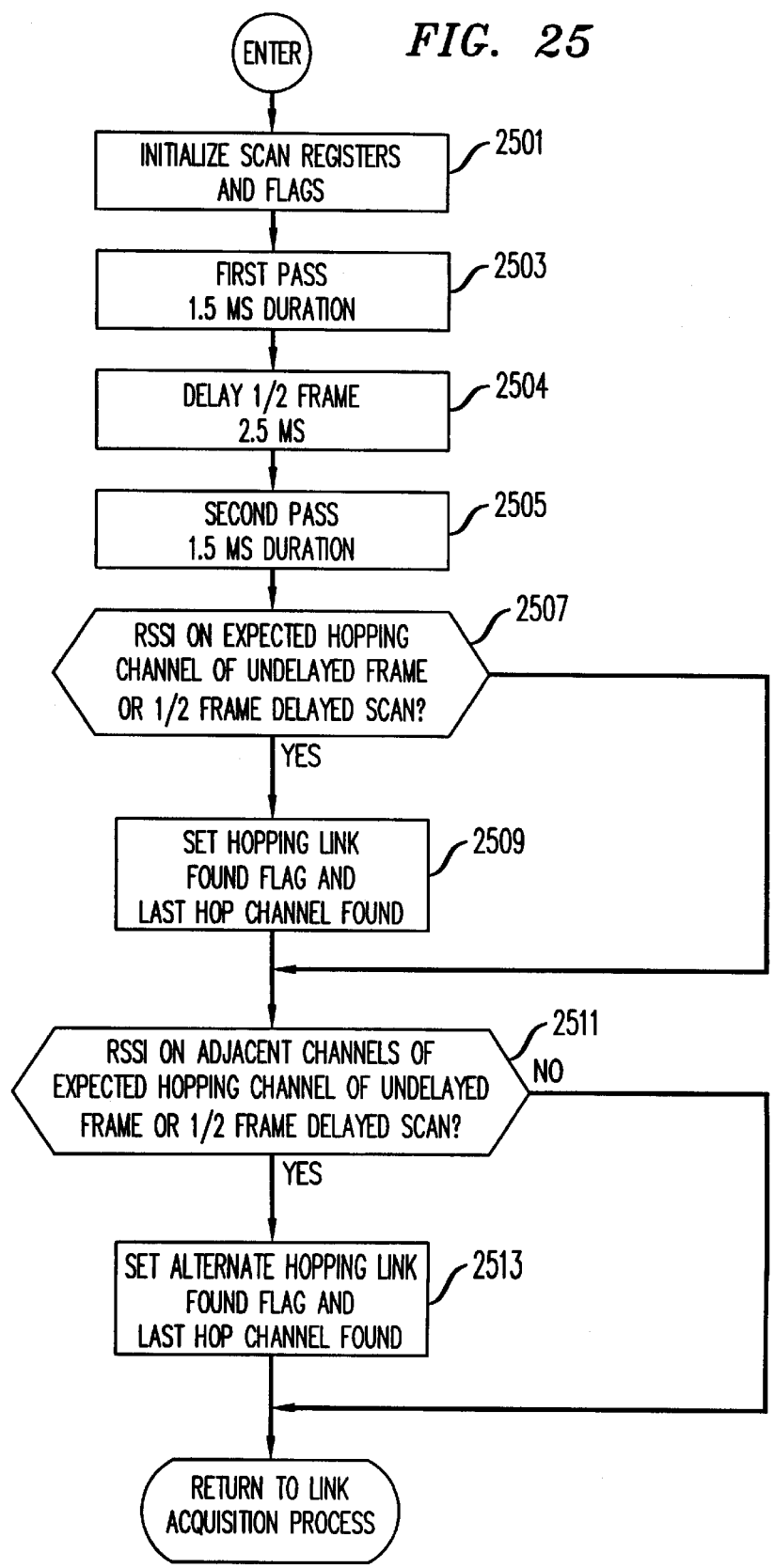
FIGS. 25 and 26 depict a second protocol of specific processes executed by the multiple portable units in performing a link acquisition, in accordance with the principles of the present invention.
Figure 26:
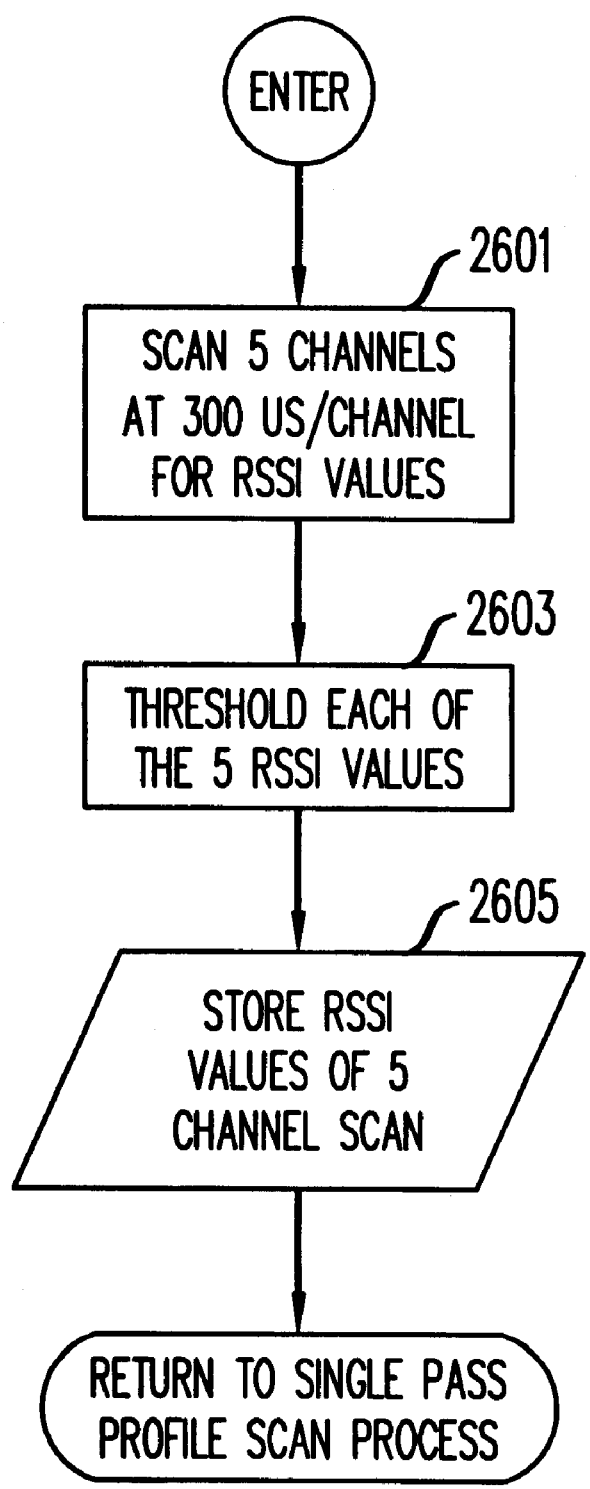

For the case where the base unit was hopping before the handset unit went to sleep in the previous sniff cycle, the process advances from decision 1504 to step 1531 where the handset unit attempts to synchronize with the base unit. The handset unit is configured to compensate for some slippage in the hopping sequence due to the 1 second sleep cycle and calculates in step 1531, five channels to perform the single pass profile scan on in step 1533. In this single pass profile scan, as illustrated in FIGS. 25 and 26 and described in detail later herein with reference to these figures, the handset unit examines the channel upon which it expects to find the signal energy, two channels in front of this channel and two channels following this channel in the frequency hopping sequence for signal energy to determine if the base unit is still hopping. If the base unit is determined to be hopping, information about the detected hop channel is provided in the found hop channel data and evaluated in step 1535. From step 1535, the process advances to step 1537 to start the synchronization process, otherwise the process goes to step 1507 and the three pass profile scan is performed.

If it is determined at decision 1509 that the base unit is not requesting that a communication link be established, the process advances to decision 1511 to determine if the handset unit awoke because of the user requesting communication with the base unit, for example, to establish an outgoing call. If this is not the case, then the handset unit enters the sniff off, or sleep, portion of the sniff cycle in step 1543. In the operation of the sniff cycle, the control unit instructs the TDD 220, shown in FIG. 2, to enter the sniff-off cycle, programs the sniff timer, and powers down the handset unit. When at decision 1511 the handset unit requests a communication link with the base unit and the process advances to step 1513. In step 1513, the handset unit turns on the transmitter and transmits an acquisition subframe on the preferred setup channels. This is performed for one complete pass of the hopping channels, or 250 ms, and the transmitter is turned off in step 1515 and the process advances to step 1517 where the handset unit scans the 50 channels to determine if the base unit is responding to its request.

In step 1517 the handset unit uses the three pass profile scan to scan each one of the 50 channels in the frequency hopping sequence. In this execution of the three pass profile scan, the handset unit examines each one of the 50 channels in the frequency hopping sequence for signal energy to determine if the base unit is attempting to contact the handset unit. If it is determined at decision 1519 that the base unit is not requesting that a communication link be established, the process returns an error state 1523 to indicate that there was a failure to establish a communication link with the base unit. From the error state, the process proceeds to step 1543 where the handset unit prepares for and enters the sniff off portion of the sniff cycle, as described above.

Once signal energy, indicative of the base unit requesting that a communication link be established, is detected, as determined by step 1519, the process advances to step 1521 where the handset unit starts hopping with the base unit using the hopping sequence generated by the common seed. In this step 1521, the handset unit joins the hopping base unit with the transmitter of the handset unit turned off. Also, in this step, the handset unit begins hopping from the channel returned in step 1517. From the step 1521, the process advances to decision 1601 where the handset unit attempts to synchronize with the base unit within five frames by detecting BigSync. From step 1601, the process advances to step 1602 where the first BigSync is qualified by acquiring a second BigSync. If in either step 1601 or 1602 the BigSync pattern is not detected within five frames the process advances to step 1621 where the handset unit prepares for and enters the sniff off portion of the sniff cycle, as described herein above. During step 1601 and 1602, the base unit provides information in the 32 bit broadcast opcode that is related to the next hop channel and also swapped channel information, which should assist the handset unit in obtaining BigSync.

If the base unit was previously hopping, as determined in decisions 1504 and 1535, and steps 1531 and 1533, the handset unit then joins the hopping base unit while operating in a receive only mode, as reflected in step 1537, i.e., with the transmitter turned off. Also at this step 1535, the handset unit then begins hopping from the channel returned from step 1533. Synchronization of the handset unit with the base unit is performed in steps 1539 and 1541, similar to steps 1601 and 1602 described above. If in either step 1539 or 1541, the BigSync pattern is not detected within five frames, the process advances to step 1507 as if the decision to advance directly from step 1504 to step 1507 were made.

The process advances from either step 1541 or step 1602 to step 1605 upon successful detection of BigSync at these two steps and evaluates at step 1605 the base unit's broadcast opcode. The handset unit performs the broadcast command, if there is one, in step 1607. The broadcast command from step 1605 is further evaluated for the terminate link command in decision 1609 and this command performed in step 1621, if so instructed, where the handset unit prepares for and enters the sniff off portion of the sniff cycle, as described above. The broadcast command is further evaluated for the handset unit's own command to request a link in decision 1611 where if the handset unit is not requesting a link the process returns to step 1605 and begins the broadcast opcode evaluation loop again. The process advances from decision 1611 to step 1614 when the handset is requesting a communication link with the base unit. The broadcast command from step 1605 is further evaluated for USR1 and USR2 slot availability in step 1614 and decision 1617 and advances to an error state step 1619 if their are no slots available and finally to step 1621 where the handset unit prepares for and enters the sniff off portion of the sniff cycle, as described above.

If either the USR1 slot or the USR2 slot is available, the handset unit advances from step 1617 to step 1701 where the handset unit's transmitter is turned on in the preferred setup channel slots with a request for a communication link. The base unit, in turn, responds to the request in step 1703 through information transmitted in the broadcast command as to which requesting handset unit won a slot, which slot it is, and whether it is an alternate hopping link. From step 1703, the process advances to decision 1707. In this decision, if an alternate hopping communication link is being established with another handset unit acting as a base unit in the "walkie talkie" mode, then the handset unit advances to step 1709 where the acting base unit selects a new hopping seed and forwards the new seed to the contacted handset unit. In step 1711, both the alternate base unit and contacted handset unit move to the new hopping sequence and the process advances to step 1714.

The loop comprising steps 1714, 1716 and 1718 is entered from step 1707 or step 1711 where the continuous evaluation of the 32 bit broadcast opcode from the base unit (or alternate base unit) is performed. The handset unit performs the base commands in step 1716 and the special link termination command in decision 1718 where the decision to terminate the link is made. If a decision is made to terminate the link in decision 1718, the handset unit advances to step 1721, prepares for and enters the sniff off portion of the sniff cycle, as described above.

Referring next to FIGS. 18 through 21, in combination, there is shown a protocol of the cordless telephone depicting the specific link acquisition processes executed by any one of the handset units in the system when acting as a base unit in the walkie talkie mode for acquisition of another one of the handset units also in the system, in accordance with the disclosed embodiment. The functions provided by control unit 210, in achieving the described protocol, is determined by a process or program stored in read-only memory associated with this control unit.

The process is entered at step 1801 where the user presses a predetermined key sequence on the handset unit which informs the handset unit that the walkie talkie mode is requested. The process next advances to step 1802 where operating power is applied to the handset unit due to the key presses. As the handset unit is powered up to its operating state in step 1802, the security code and the seed are retrieved from memory and the registers of the TDD 220 also are initialized with the 50 hopping channels, as reflected in this step. From step 1802, the process advances to decision 1803 where a determination is made as to whether the base unit was hopping just before the handset unit went to sleep in the previous sniff cycle. If not, the process advances to step 1805 where the handset unit uses the three pass profile scan to scan each one of the 50 channels in the frequency hopping sequence. In this three pass profile scan, the handset unit examines each one of the 50 channels in the frequency hopping sequence for signal energy to determine if the base unit, or another handset unit acting as the base unit, is communicating over the communication link.

If the base unit was determined to be hopping before the handset unit went to sleep in the previous sniff cycle, the process advances from decision 1803 to step 1820 where the handset unit attempts to synchronize with the base unit. The handset unit expects some slippage in the hopping sequence due to the one second sleep cycle and calculates five channels in step 1820 on which it performs the single pass profile scan in step 1822.

In this single pass profile scan, as illustrated in the process shown in FIGS. 25 and 26 and described in detail later herein with reference to these figures, the handset unit examines each one of the five channels in the frequency hopping sequence for signal energy to determine if the base unit is still hopping. Information about the detected hop channel is provided in the found hop channel data and evaluated in decisions 1824 and 1826. If the base unit is determined to be hopping and no alternate hop channel data found, the process advances to decision 1828 to start the synchronization process. If the base unit is not hopping, as reflected in decision 1824, nor is a handset unit acting as a base unit found to be hopping, as reflected in decision 1826, the process advances to step 1805 and the 50 channels are scanned in the three pass profile scan, as described above.

If it is determined at decisions 1807 and 1809 that a base unit is requesting that a communication link be established, the process advances to the decision 1810 to determine if an other handset unit is acting as a base unit in walkie talkie mode by the detection of an alternate hop channel returned from the three pass profile scan. If an alternate hop channel is found, then the handset unit notifies the user that the system is busy and enters the sniff off, or sleep, portion of the sniff cycle, as reflected instep 1834. At this time, the control unit 210 instructs the TDD 220 to enter the sniff-off cycle, programs the sniff timer, and powers down the handset unit. If it is determined at decisions 1807 and 1809 that a base unit is not requesting a communication link be established, the process advances to the step 1902.

Once signal energy, that is indicative of a base unit requesting a communication link, is detected, as determined by the steps 1807 and 1909, the process advances to step 1813 where the handset unit starts hopping with the base unit using the hopping sequence generated by the common seed. The handset unit joins the hopping base unit in the receive only mode with the transmitter turned off The base unit also begins hopping using the channel returned from the three pass profile scan, as reflected in step 1805. From step 1813, the process advances to decision 1815 where the handset unit attempts to synchronize with the base unit within five frames by detecting BigSync. If BigSync is acquired in decision 1815, the process advances to decision 1817 where the first BigSync is qualified with a second BigSync. If in either step 1815 or 1817, the BigSync pattern is not detected within five frames the process advances to step 1902 where the handset unit has determined that a base unit was not found and begins hopping starting with the first channel of the 50 channel hopping sequence. If a base unit was determined to be hopping at decision 1817, however, the handset unit starts hopping, illustratively, at two frames ahead of the base unit in step 1901. This shifted hopping provides, in accordance with the disclosed embodiment, the alternate hop channel for a handset unit to use during link acquisition when the base unit is also found to be hopping. During steps 1815 and 1817 the base unit provides in the 32 bit broadcast opcode information related to the next hop channel, as well as swapped channel information, which should assist the handset in obtaining BigSync.

If the base unit was previously hopping as determined in decision 1803 and step 1822 and that the alternate hop channel was not found as determined in step 1826, the handset unit joins the hopping base unit in the receive only mode with the transmitter turned off The handset unit then begins hopping starting with the channel found in the single pass scan, as reflected in step 1828. Synchronization of the handset unit with the base unit is performed in steps 1830 and 1832, in a manner similar to steps 1815 and 1817, as described above. From these steps, specifically step 32, the process advances to step 1901. If in either step 1830 or 1832 the BigSync pattern is not detected within five frames the process goes to step 1805 as if the decision to advance from decision 1803 to step 1805 were made. If the alternate hop channel is found, as determined in step 1826, the handset unit notifies the user that the system is busy and enters the sniff-off, or sleep, portion of the sniff cycle in step 1834 and prepares for the sniff-off cycle as described above.

The process advances from either step 1901 or step 1902 to 1904 where the handset unit prepares for establishing a communication link with another handset unit or other handset units upon successful detection of hopping and BigSync. In step 1904 the handset unit turns on the transmitter and transmits an acquisition subframe by dotting in both the USR1 and USR2 slots. From step 1904 the process advances to step 1906 where the handset unit transmits a 32 bit base broadcast opcode and enters an acquisition loop, as determined by decisions 1908, 1910 and 1918, waiting for a handset unit communication request as indicated by the detection of the first BigSync. If the user of the source handset unit in the walkie talkie mode terminates the link by pressing a certain key, the acquisition loop is terminated, as reflected in decision 1918. If there is no existing communication link established, the handset unit acknowledges the user's key press in step 1922 and the handset unit enters the sniff off, or sleep, portion of the sniff cycle in step 1924.

If the first BigSync is detected, as reflected in decision 1908, this synchronization signal is then qualified in step 1910 in the same manner as described in step 1817 above. In the event of a failure to obtain the second BigSync, the acquisition loop in step 1908 is continued. Upon successful detection and qualification of BigSync, the source handset unit assigns one of the USR1 or USR2 slots to the requesting handset unit, as reflected in step 1912 and informs the other handset units in the system of the assignment and the status of the USR1 and USR2 slots, via the base broadcast opcode in step 1914. The process next advances to step 2001 where the source handset unit and contacted handset unit in the system enter the traffic bearing transmission mode and the unused USR slot, if there is one, is transmitted as an acquisition subframe in step 2003.

From step 2003, the process advances to decision 2006 wherein the opcode of the contacted handset unit is evaluated and the status of the link between the source handset unit and the contacted handset unit is monitored in decisions 2008 and 2012. If the handset link for the contacted handset unit has been terminated, as determined by decision 2008, then the process advances to step 2020 wherein it is determined whether the handset link for USR1 or USR2 was terminated. From step 2020, the process then advances to decision 2022 for determining whether a communication link exist in the slot for USR1 or USR2. If so, the process then returns to the step 2003 where the unused USR slot is then used as an acquisition subframe.

If the handset link has not been terminated, as determined in decision 2008, the process advances to decision 2010 where it is determined if any requests have been generated by the contacted handset unit then communicating with the source handset unit over the communication link. If so, the source handset unit performs the one or more requests in step 2014. From step 2014 and, if there are no requests, as reflected in decision 2010, the process advances to decision 2012 where it is determined if the source handset unit link has been terminated. If so, the process advances to step 2020. If not, the process advances to the decision 2016 where it is determined if any requests have been generated by the source handset unit. If so, the contacted handset unit performs the one or more requests in step 2028. From step 2028 and, if there are no requests, from decision 2016, the process advances to decision 2101 where a determination is made as to whether the USR1 or the USR2 time slot is available for another system handset unit to establish communications with the source handset unit.

If there are no slots available, as determined in decision 2101, then the process returns to decision 2006 for further evaluation of subsequent opcodes. If either USR1 or the USR2 time slot is available and the source handset unit, as indicated in step 2103, or the contacted handset unit, as indicated in step 2105, is requesting a communication link be established with a system handset unit, the process then returns to step 1906 where the source handset unit transmits its broadcast commands to the system handset unit or units and performs the link acquisition process.

In the execution of this process, as described in FIGS. 18 through 21, the source handset unit performing the walkie talkie mode continually cycles among the steps and decisions described herein above for recognizing and establishing communications over a communication link with one or two handset units from among a plurality of associated system handset units.

FIGS. 22 through 24 depict a first protocol of specific processes executed by the base unit and/or each of the multiple handset units in performing a link acquisition. The purpose of the three profile scan is to build up over time three tables with information about the energy in the channels in the frequency spectrum that is used by the hopping units in the cordless telephone system. As reflected by the tables, in the spectrum will be energy from a hopping base unit or handset unit that will appear as a pattern in the tables. By applying correlation algorithm methods to three data points, i.e., one from each table, the hopping pattern will be detected.

The process is entered in step 2201 where a channel-found register and an the in-use channels of the frequency hopping cycle are also stored for later use in the process alternate channel-found register and associated flags are cleared. In this step,. From step 2201, the process advances to step 2203 where a first measurement of the 50 hopping channels is obtained over a 15 millisecond scan period. This first measurement or first pass executes a process reflected by the subroutine shown in FIG. 24.

Turning briefly to FIG. 24 and the subroutine shown therein, in this subroutine, the RSSI value of each of the 50 hopping channels is obtained by having the process visit all of the 50 hopping channels in the 15 millisecond scan period. The process dwells on each of these 50 channels for 300 microseconds, as shown in step 2401, during this scan period. Next, the process thresholds or assigns a value for each of the 50 RSSI values in step 2403. Finally, the process stores the RSSI values for each of the 50 channels in step 2405. For the first pass, as reflected in step 2203, this data is stored in a first pass table Referring once again to FIG. 22, from step 2203, the process advances to step 2205 where a second measurement of the 50 hopping channels is obtained over a 15 millisecond scan period. This second measurement or second pass executes the same subroutine shown in FIG. 24 as does the first pass and the data from this pass is stored in a second pass table.

From step 2205, the process advances to step 2207 where a third measurement of the 50 hopping channels is obtained over a 15 millisecond scan period. This third measurement or third pass executes the subroutine shown in FIG. 24 and the data from this pass is stored in a third pass table.

From step 2207, the process advances to step 2208 where a one half frame delay is provided before executing the next three series of measurements. The purpose of this delay is to insure that measurements of the spectrum energy are made while the unit that is being looked for is transmitting during some of the multiple passes. Otherwise, the scan can be performed and dwell on a channel during the time that the searched-for unit is configured in its receive state.

From step 2208, the process advances to step 2209 where a fourth measurement of the 50 hopping channels is obtained over a 15 millisecond scan period. This fourth measurement or fourth pass executes the same subroutine shown in FIG. 24 as does the previous passes and the data from this pass is stored in a fourth pass table.

From step 2209, the process advances to step 2211 where a fifth measurement of the 50 hopping channels is obtained over a 15 millisecond scan period. This fifth measurement or fifth pass executes the subroutine shown in FIG. 24 and the data from this pass is stored in a fifth pass table.

From step 2211, the process advances to step 2213 where a sixth measurement of the 50 hopping channels is obtained over a 15 millisecond scan period. This sixth measurement or sixth pass executes the subroutine shown in FIG. 24 and the data from this pass is stored in a sixth pass table. This sixth pass, along with the previously described five passes, provides the information necessary for reliably detecting the hopping pattern of an active unit that is frequency hopping in the system.

From step 2213, the process advances to step 2215 where the undulated correlation coefficients are calculated for the tables obtained in the first, second and third passes. In this calculation, as taught by Proakis et al. in *Digital Signal Processing Principles, Algorithms, and Applications*, the algorithm is applied to the three measured and thresholded RSSI values for each of the 50 channels, i.e., one from each of the three undelayed pass tables. The process is repeated for each of the 50 channels and data about the channel with the highest correlation coefficient is stored for later recall and comparison. The data stored is the calculated correlation coefficient value and the table entry number, which represents the hopping channel found. For example, if the first element of the first table, the fourth element of the second table, and the seventh element of the third table was determined, in computation, to have the highest correlation coefficient, say 0.95, then correlation coefficient 0.95 and channel1 would be saved. Also from this process the channel with the next highest correlation coefficient is similarly stored for later recall.

From step 2215, the process advances to step 2301 where the delayed correlation coefficients are calculated for the tables obtained in the fourth, fifth and sixth passes. In this calculation, the algorithm is again applied to the three measured and thresholded RSSI values for each of the 50 channels, i.e., one from each of the three delayed pass tables. The process is repeated for each of the 50 channels and the data about the channel with the highest correlation coefficient is stored for later recall and comparison, in a manner similar to the previous undelayed correlation coefficient calculation. The data stored is the calculated correlation coefficient value and the table entry number, which represents the hopping channel found. Also from this process the channel with the next highest correlation coefficient is similarly stored for later recall.

From step 2301 the process advances to step 2305 where the stored correlation coefficients and associated channel information from steps 2215 and 2301 is processed to determine if a hopping sequence which is indicative of transmissions by the base unit, or by one of the handset units, is detected. The highest correlation coefficient value from step 2215 is compared with the highest correlation coefficient value from step 2301 and the stored data, correlation coefficient value and table entry number, for the larger of the two values and an indication of a successful detection, is returned to the calling acquisition routine. For example, the primary-found-channel register, associated flag, and which set of measurements, delayed or undelayed are returned to the calling acquisition routine. In addition, the associated next highest correlation coefficient stored data indicative of the successful primary-found-channel and an indication of a successful detection is also returned to the calling acquisition routine at the same time. For example, the alternate-found-channel register and associated flag are returned to the calling acquisition routine. Step 2307 provides an indication that the undelayed table was successful in detecting a hopping sequence indicative of the base unit transmitting and step 2309 provides an indication that the delayed table was successful in detecting a hopping sequence indicative of the base unit transmitting. The process advances from decision 2305 to step 2311 in the case where a failure to calculate and determine through comparison that there is indeed a highest correlation coefficient and returns to the calling acquisition routine the link-not-found flag.

FIGS. 25 and 26 depict a second protocol of specific processes executed by the handset units in performing a link acquisition. The purpose of the single pass profile scan is to build up three tables over time with information about the energy in five channels that are used by the hopping units in the frequency spectrum. As reflected by the tables, in the spectrum will be energy from a hopping base unit that appears as a pattern in the tables. By applying correlation algorithm methods to three data points, one from each table, the hopping pattern will be detected.

The process is entered in step 2501 where the primary-channel-found register and alternate-channel-found register and associated flags are cleared. In this step, five of the in-use channels of the frequency hopping cycle are also stored for later use in the process. From step 2501, the process advances to step 2503 where a first measurement of five of the 50 hopping channels is obtained over a 1.5 millisecond scan period. One of these five channels is expected to contain signal energy indicative of the channel upon which the base unit is then hopping. This first measurement or first pass executes the five channel profile scan subroutine, as shown in FIG. 26.

Referring briefly to FIG. 26, in this subroutine, the RSSI values of the five hopping channels are obtained by having the process visit only five of the 50 hopping channels in the 1.5 millisecond scan period. The process dwells on each of the five channels for 300 microseconds as shown in step 2601 during this scan period. Next, the process thresholds each of the five RSSI values in step 2603. Finally, the process stores the RSSI values for each of the five channels in step 2605. For the first pass, this data is stored in a first pass table.

Returning now to FIG. 25, from step 2503, the process advances to step 2504 where the process is delayed until a one-half frame delay, or 2.5 millisecond delay, from the beginning of the first pass measurement process is provided before executing the second pass measurement. The purpose of this delay is to insure that measurements of the spectrum energy are made while the unit that is being looked for is transmitting during at least one of the passes. Otherwise, the scan can be performed and dwell on a channel during the time that the searched-for unit is in its receive state.

From step 2504, the process advances to step 2505 where a second measurement of five of the 50 hopping channels is obtained over a 1.5 millisecond scan period. This second measurement or second pass executes the same subroutine shown in FIG. 26 as does the previous pass and the data from this pass is stored in a second pass table.

From step 2505, the process advances to decision 2507 where the undelayed RSSI values for each of the five hopping channels are examined and compared to the delayed RSSI values for the five hopping channels. The hopping channel with the expected RSSI value is returned to the calling acquisition routine in the primary-found-channel register and the channel-found flag is set as indicated in step 2509.

From step 2509, the process advances to decision 2511 where the RSSI values on adjacent channels in the table where the primary-found-channel was determined to be are examined and evaluated as to be sufficient to qualify as an alternate channel. If so, the hopping channel with the qualified RSSI value is returned to the calling acquisition routine in the alternate-found-channel register and the alternate-found flag is set, as indicated in step 2513. From the step 2513, the process returns to the link acquisition process then being executed.

It is to be understood that various modifications of this invention are possible and may obviously be resorted to by those skilled in the art without departing from the spirit and scope of the invention as hereinafter defined by the appended claims.

APPENDIX ONE

```
*       ******************************************
*****
*       GEN_LIST  Generate a maximal length pseudorandom list of
*           channels.
***************************************************
                                            PORT
*                                           bits
*                                           ram
*       rand_num,ran_seed
*                                   equates
*       MSK         equ         $b8
        get_seed
*
                lda     ACLR        Gather 8 bits.
                sta     ran_seed    Start at one.
                rts
        gen_list
                lda     ran_speed   ;
                brclr   0,ran_seed,gen_1_1
                lsra
                eor     #MSK
                bra     gen_1_2
        gen_1_1
                lsra
        gen_1_2
                sta     ran_seed
                sta     rand_num
        gen_1_3
                lda     rand_num
                cmp     #MAX_FREQ
                bhi     gen_list    ; Branch if Acca.> memory. OK
                rts
```

We claim:

1. A method of establishing communications between a first and a second telephone unit in a cordless telephone employed in a frequency hopping system, the first and second telephone units being capable of communicating over any one of a plurality of communication channels, the method comprising the steps of:

storing data that is indicative of a set of channels used by said first and said second telephone units in a frequency hopping cycle, said set of channels being within the plurality of communication channels;

scanning each channel within the set of channels for detecting spectrum energy indicative of said first telephone unit frequency hopping in said frequency hopping cycle;

determining correlation coefficient values from said detected spectrum energy; and comparing said correlation coefficient values for selecting a one of said correlation coefficient values which represents a frequency channel in the frequency hopping cycle for said second telephone unit to start hopping along with said first telephone unit.

2. The method of claim 1 wherein said scanning step includes the step of multiple scanning of said set of channels.

3. The method of claim 2 wherein said multiple scanning step includes the step of scanning said set of channels for a first, time period, in said first time period each channel in the set of channels being scanned for a first, second and third time.

4. The method of claim 3 wherein said first time period is 45 milliseconds and the set of channels is scanned in 15 milliseconds during each of said first, second and third time.

5. The method of claim 3 wherein said multiple scanning step further the step of inserting a delay period after said first time period.

6. The method of claim 5 wherein delay period is for one-half of the time the first telephone unit spends on each channel in the set of channels.

7. The method of claim 6 wherein delay period is for 2.5 milliseconds.

8. The method of claim 5 wherein said multiple scanning step further includes the step of scanning said set of channels for a second time period, in said second time period each channel in the set of channels being scanned for a fourth, fifth and sixth time.

9. The method of claim 8 wherein said second time period is 45 milliseconds and the set of channels is scanned in 15 milliseconds during each of said fourth, fifth and sixth time.

10. The method of claim 9 wherein said set of channels are five in number.

11. The method of claim 2 wherein said multiple scanning step includes the step of scanning said set of channels for a first, time period, in said first time period each channel in the set of channels being scanned once.

12. The method of claim 11 wherein said multiple scanning step further the step of inserting a delay period after said first time period.

13. The method of claim 12 wherein said multiple scanning step further includes the step of scanning said set of channels for a second time period, in said second time period each channel in the set of channels being scanned once.

14. The method of claim 13 wherein said set of channels are five in number.

* * * * *